US012677684B2

(12) United States Patent
Yoo et al.

(10) Patent No.: US 12,677,684 B2
(45) Date of Patent: Jul. 7, 2026

(54) SEMICONDUCTOR PACKAGE

(71) Applicant: LG INNOTEK CO., LTD., Seoul (KR)

(72) Inventors: Hodol Yoo, Seoul (KR); Seongun Eom, Seoul (KR); Yongsoo Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 536 days.

(21) Appl. No.: 18/138,180

(22) Filed: Apr. 24, 2023

(65) Prior Publication Data

US 2023/0411268 A1    Dec. 21, 2023

(30) Foreign Application Priority Data

Jun. 15, 2022    (KR) ........................ 10-2022-0072782

(51) Int. Cl.
| | |
|---|---|
| *H01L 23/498* | (2006.01) |
| *H01L 23/00* | (2006.01) |
| *H01L 25/10* | (2006.01) |
| *H10B 80/00* | (2023.01) |
| *H10W 70/65* | (2026.01) |
| *H10W 70/685* | (2026.01) |
| *H10W 90/00* | (2026.01) |
| *H10W 70/60* | (2026.01) |
| *H10W 72/00* | (2026.01) |
| *H10W 72/20* | (2026.01) |

(Continued)

(52) U.S. Cl.
CPC ............ *H10W 70/65* (2026.01); *H10B 80/00* (2023.02); *H10W 70/685* (2026.01); *H10W 90/00* (2026.01); *H10W 90/401* (2026.01); *H10W 90/701* (2026.01); *H10W 70/60*

(2026.01); *H10W 72/01* (2026.01); *H10W 72/287* (2026.01); *H10W 72/823* (2026.01); *H10W 74/15* (2026.01); *H10W 90/28* (2026.01); *H10W 90/722* (2026.01); *H10W 90/724* (2026.01); *H10W 90/734* (2026.01)

(58) Field of Classification Search
None
See application file for complete search history.

(56) References Cited

U.S. PATENT DOCUMENTS

| | | |
|---|---|---|
| 2005/0023704 A1 | 2/2005 | Lin et al. |
| 2016/0007459 A1 | 1/2016 | Kim et al. |
| 2021/0098404 A1* | 4/2021 | Miyazawa .......... H01L 23/5381 |

FOREIGN PATENT DOCUMENTS

| | | |
|---|---|---|
| KR | 10-2016-0004828 A | 1/2016 |
| KR | 10-2016-0138753 A | 12/2016 |

* cited by examiner

*Primary Examiner* — Lawrence C Tynes, Jr.
(74) *Attorney, Agent, or Firm* — Birch, Stewart, Kolasch & Birch, LLP

(57) ABSTRACT

A semiconductor package substrate including a substrate; a first protective layer disposed on the substrate and including a through hole; and a second protective layer disposed inside the through hole of the first protective layer and spaced apart from the first protective layer, wherein a first edge of the first protective layer faces a first edge of the second protective layer, wherein a space between the first edge of the first protective layer and the first edge of the second protective layer includes at least a first separation region and a second separation region, and wherein a first width of the space in the first separation region is different than a second width of the space in the second separation region.

21 Claims, 16 Drawing Sheets

(51)  Int. Cl.
H10W 74/15         (2026.01)
H10W 90/28         (2026.01)

【FIG. 1】
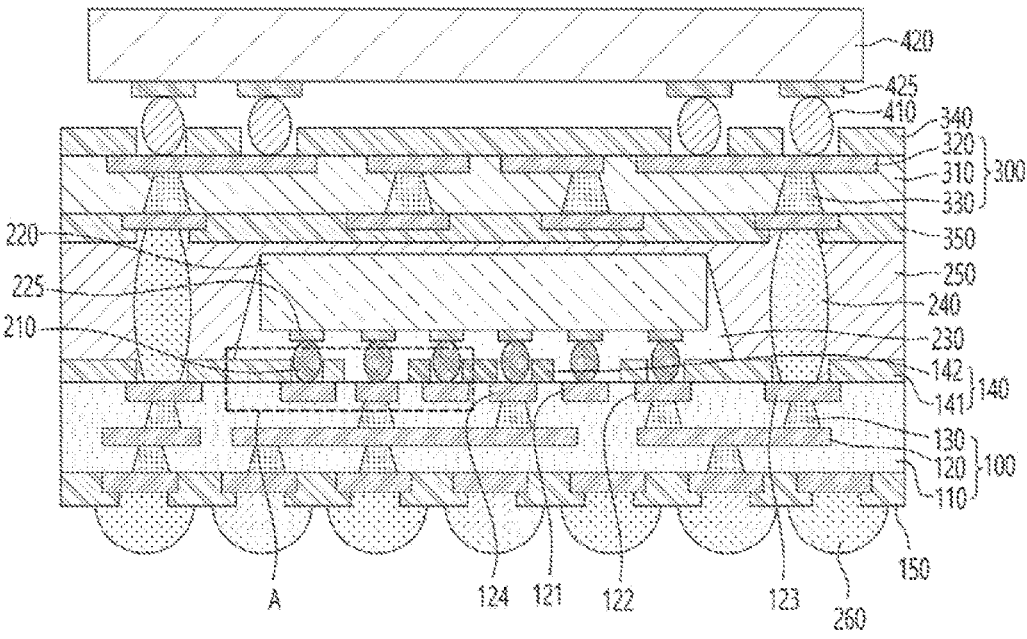
【FIG. 2】
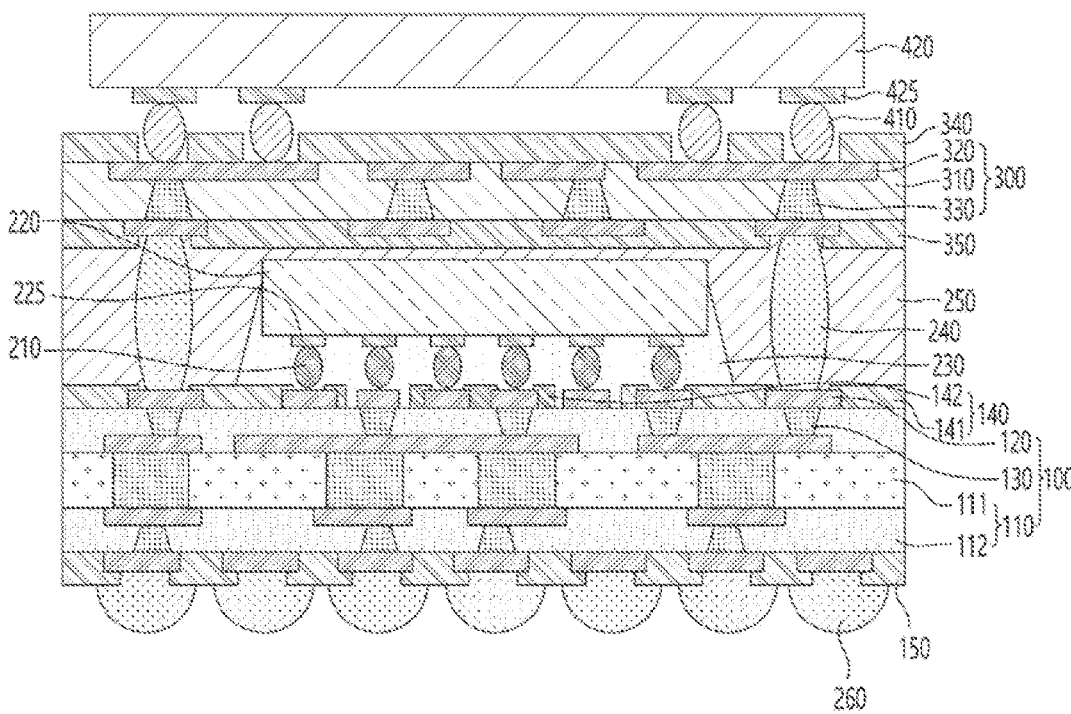

【FIG. 3】
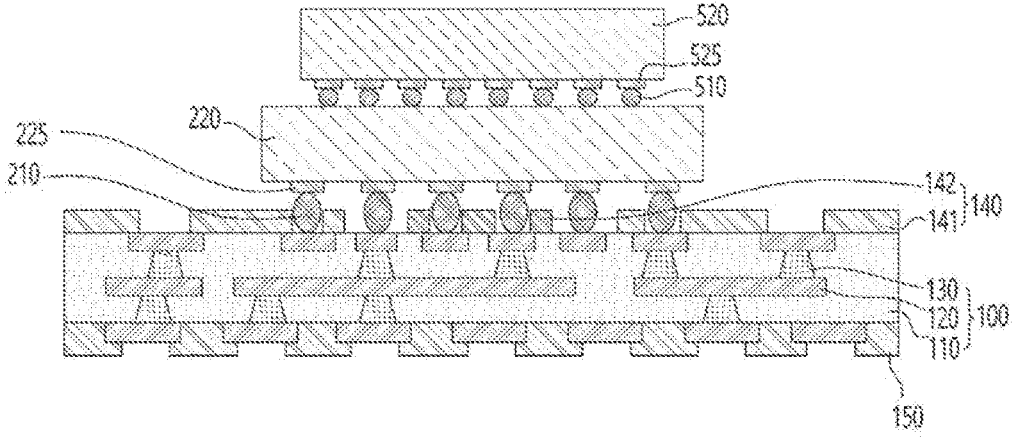
【FIG. 4】
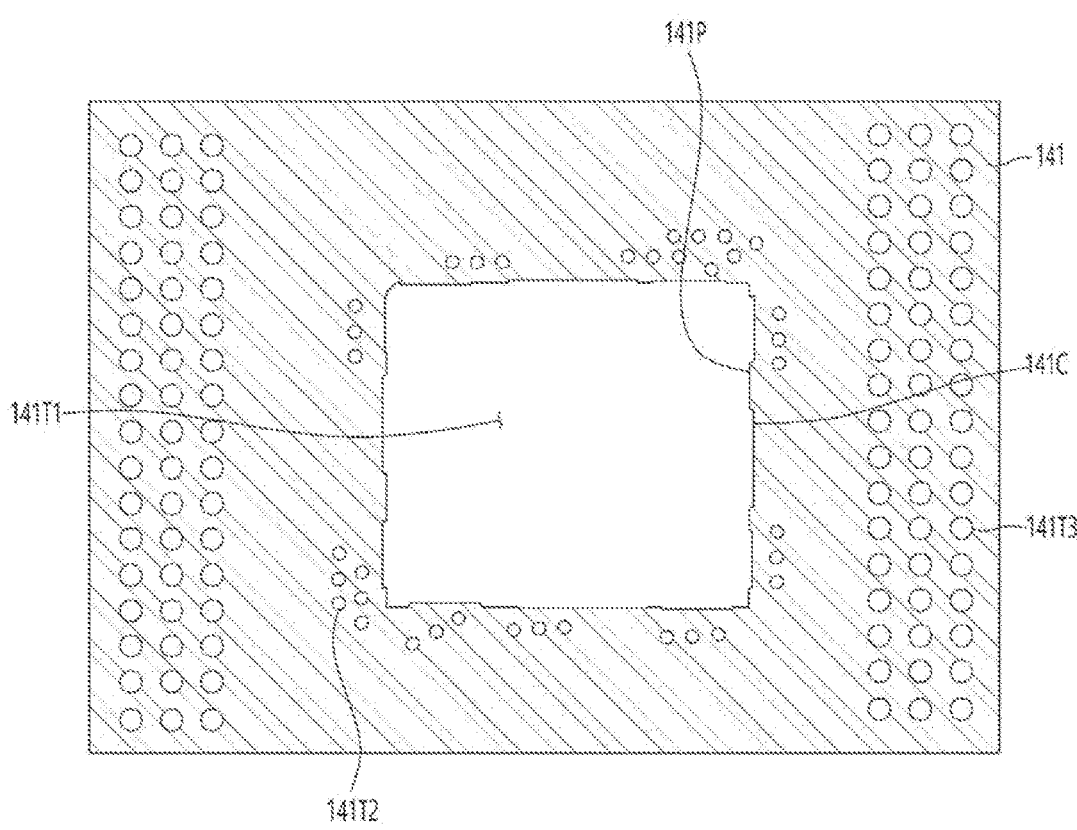

【FIG. 5】
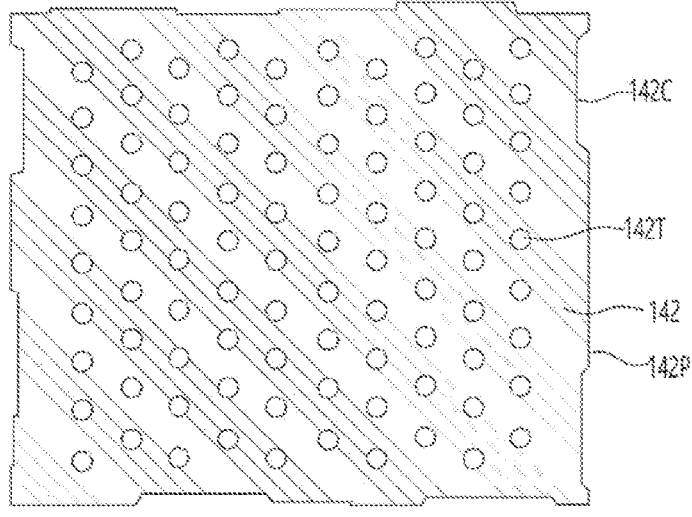
【FIG. 6】
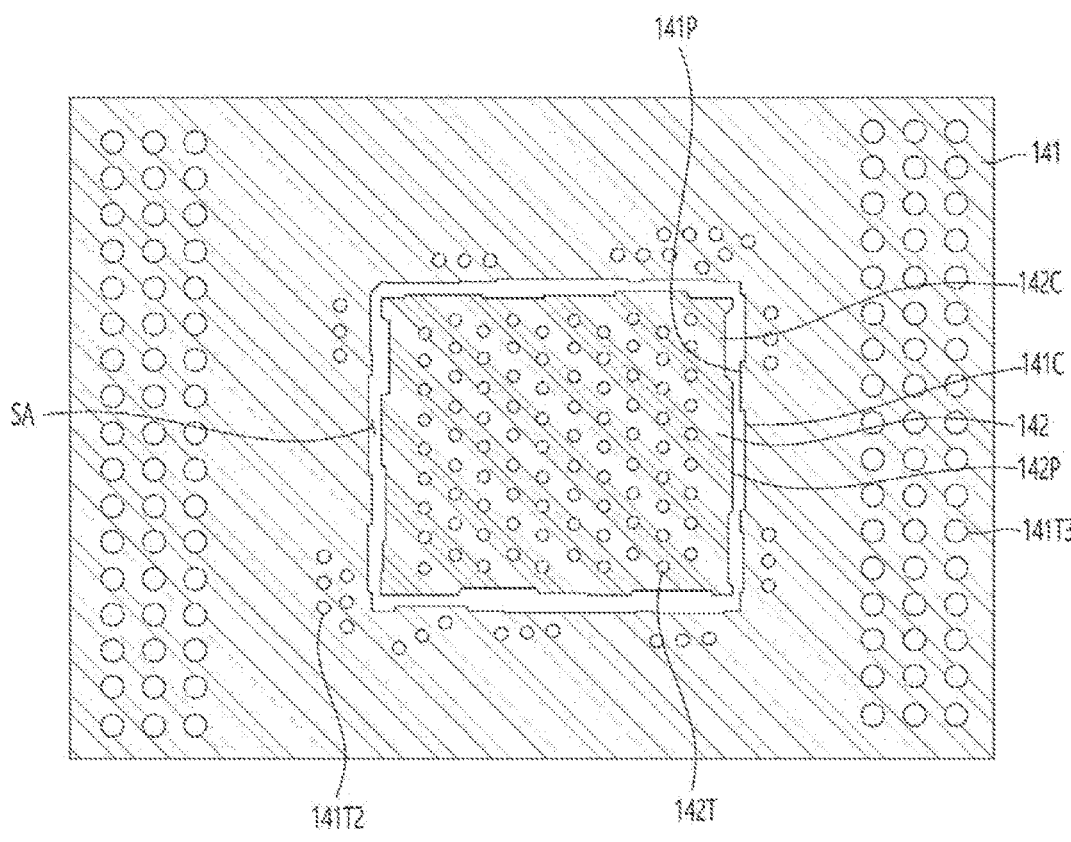

[FIG. 7]
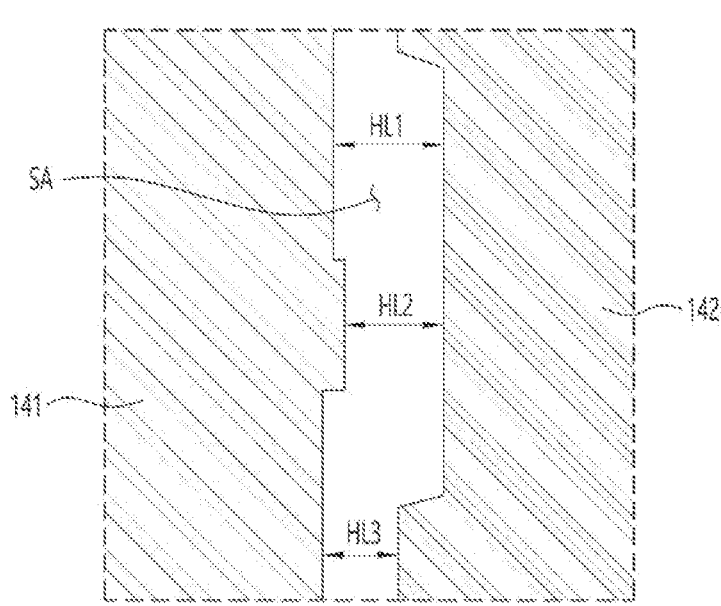

[FIG. 8]
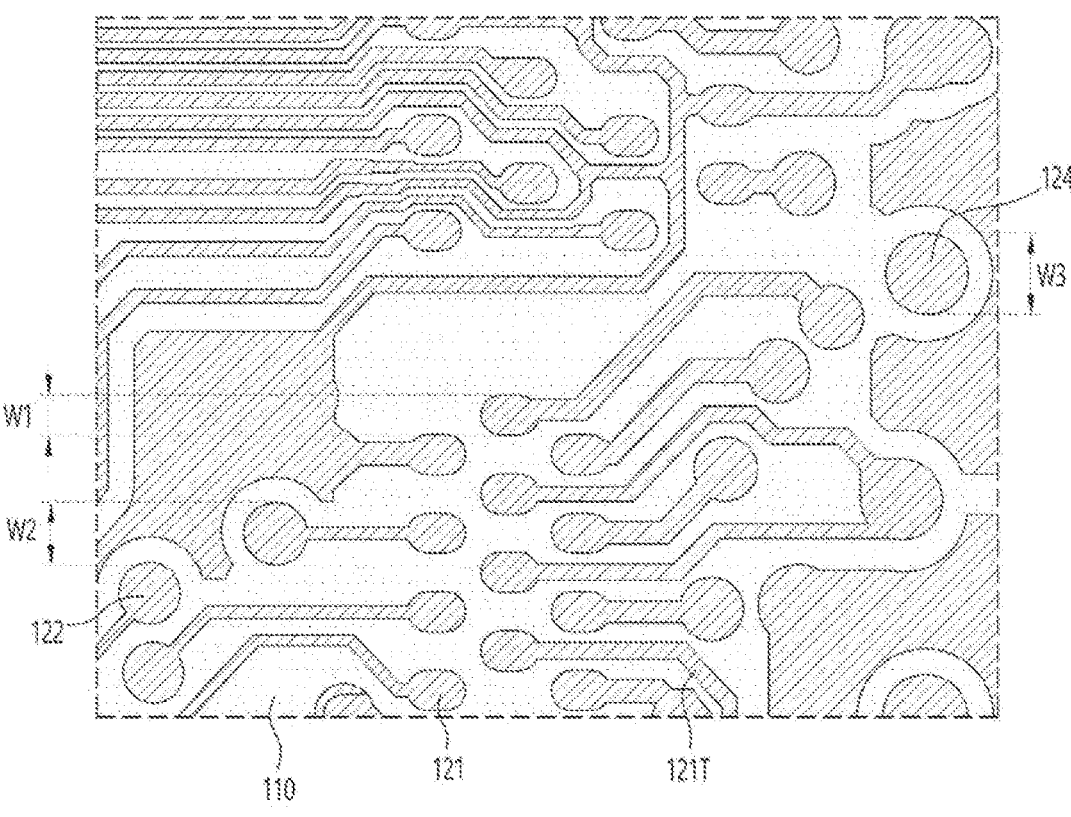

[FIG. 9]
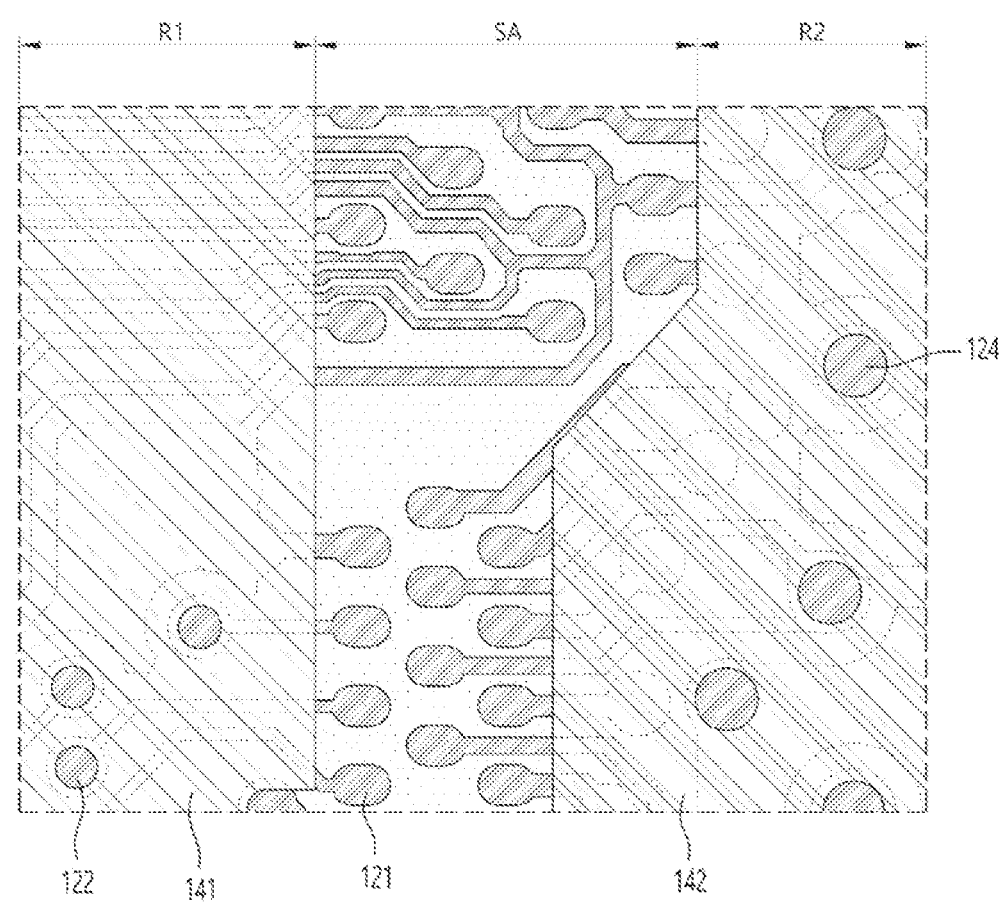

[FIG. 10]
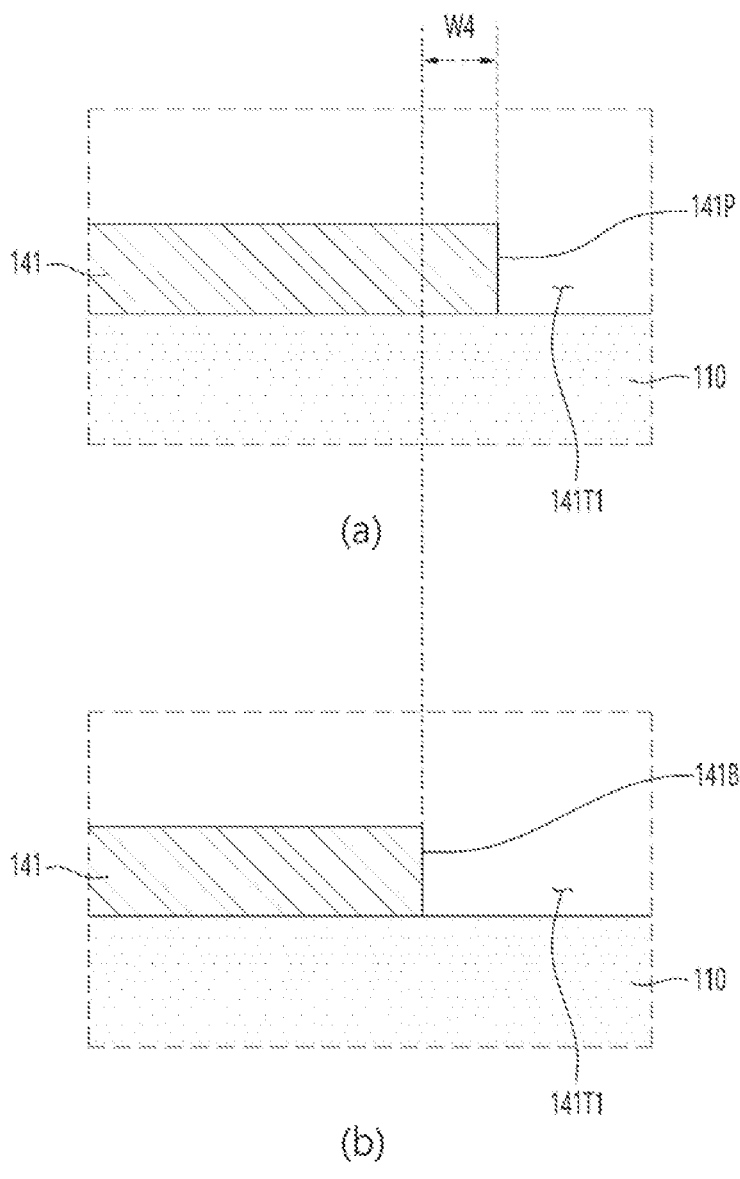
(a)
(b)

[FIG. 11a]
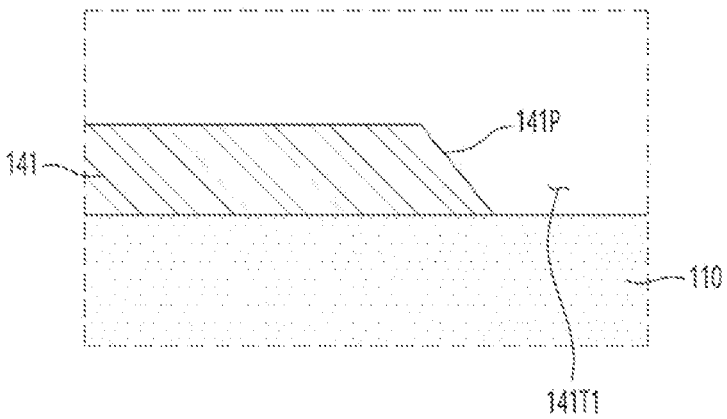
[FIG. 11b]
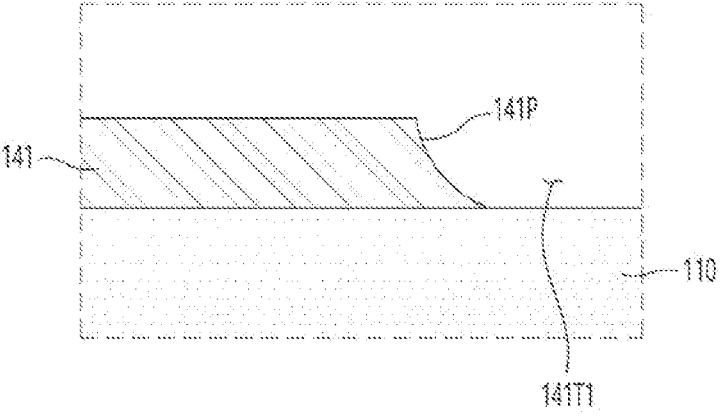

[FIG. 11c]
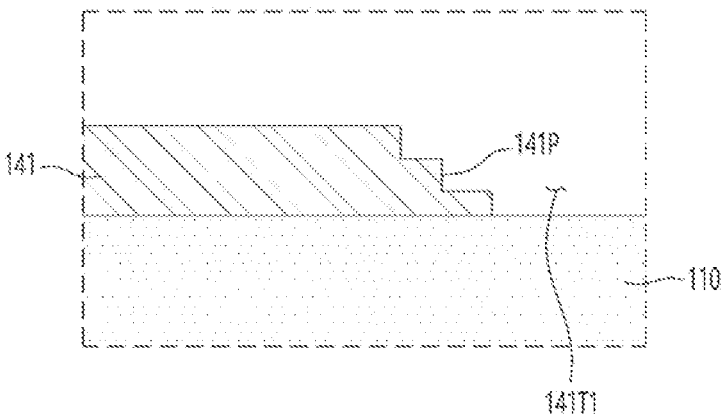
[FIG. 11d]
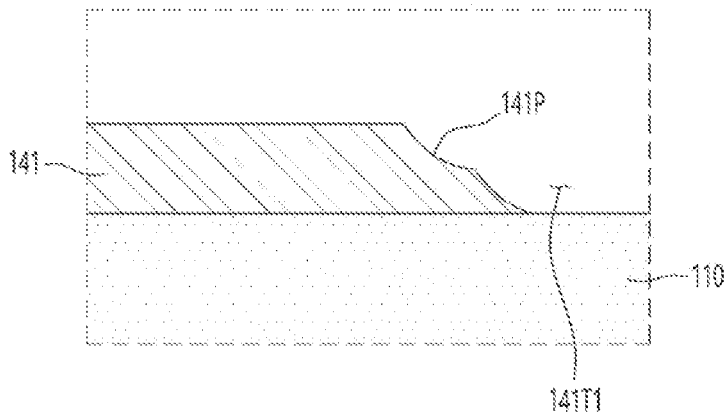

[FIG. 12a]
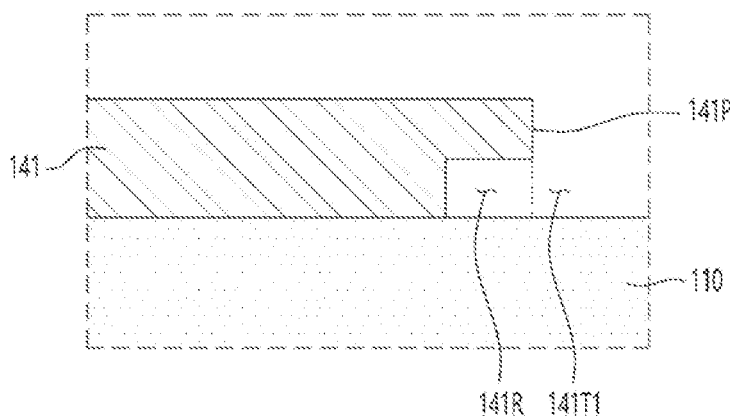
[FIG. 12b]
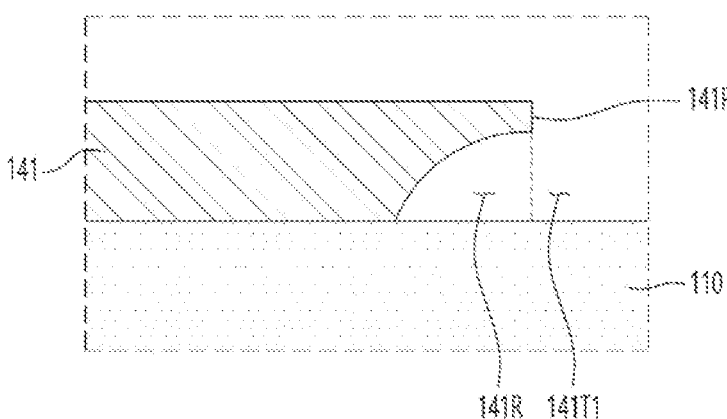

[FIG. 13]
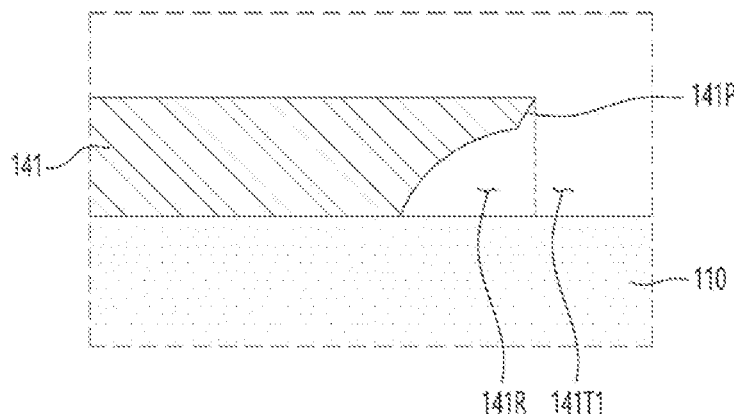
[FIG. 14]
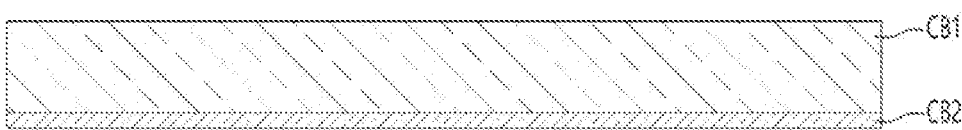
[FIG. 15]
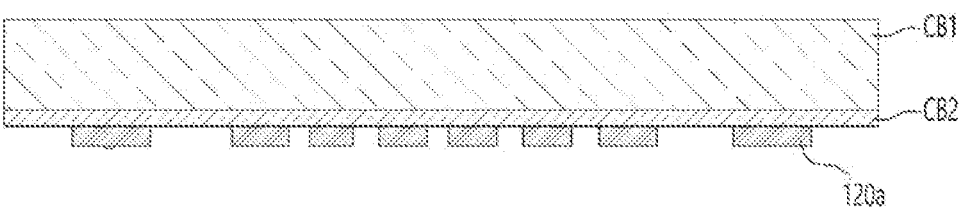

【FIG. 16】
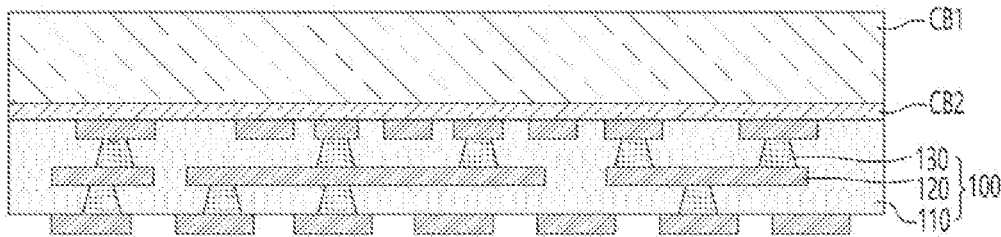
【FIG. 17】
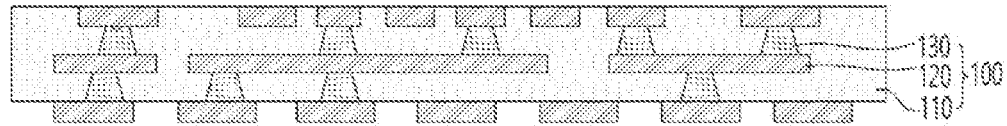
【FIG. 18】
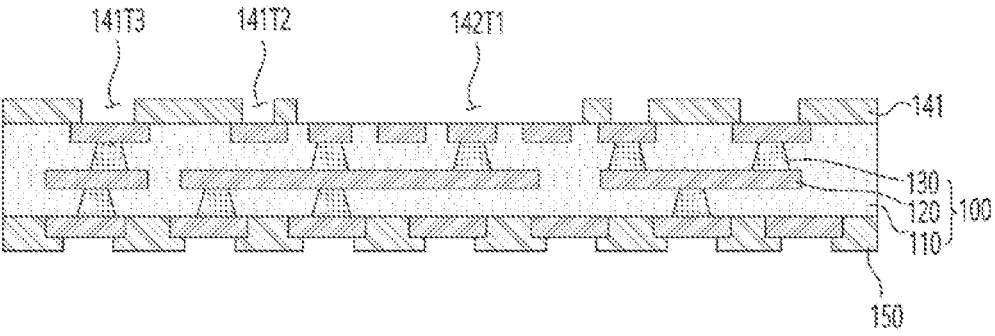

[FIG. 19]
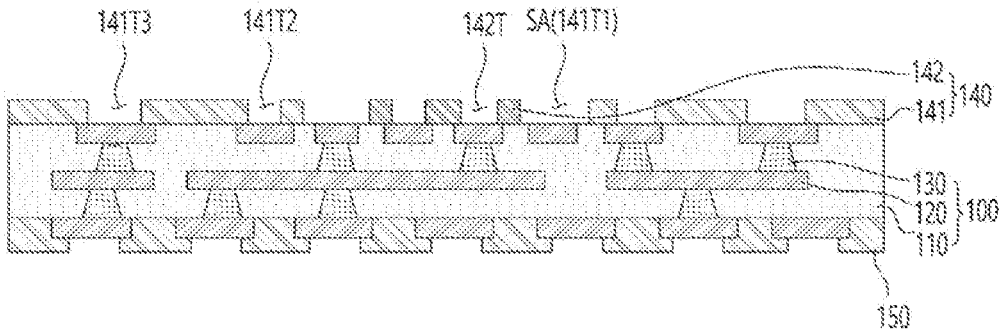
[FIG. 20]
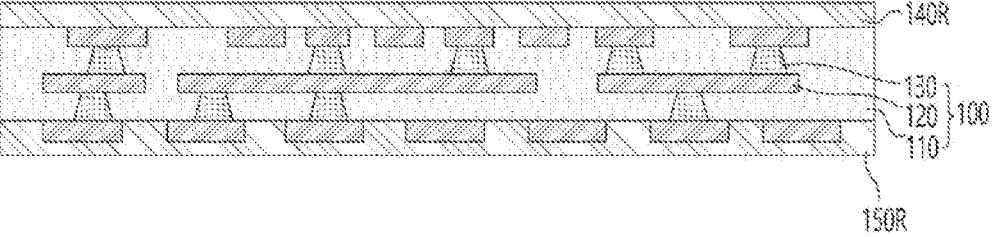
[FIG. 21]
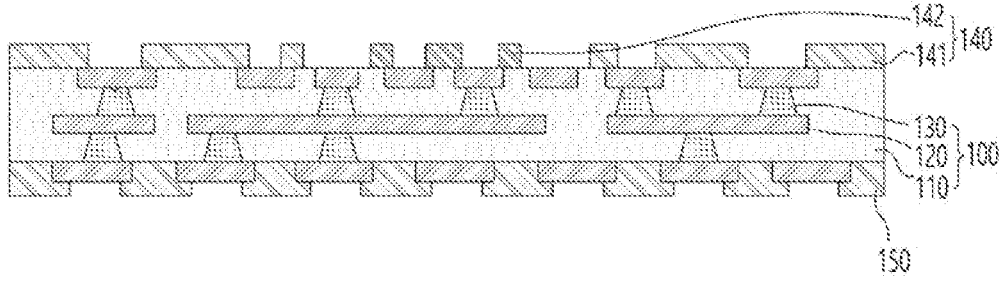

[FIG. 22]
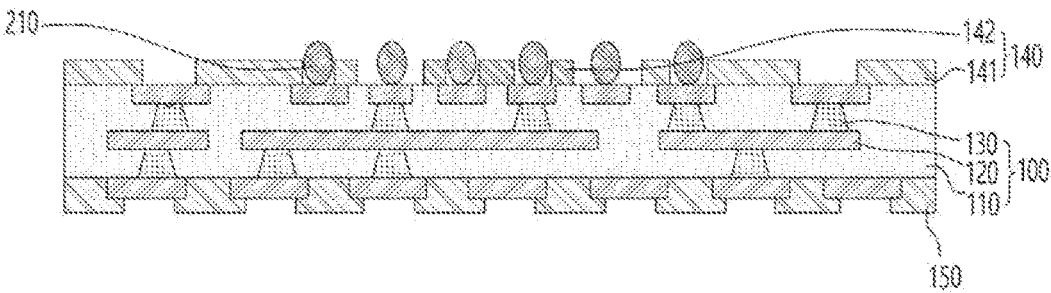
[FIG. 23]
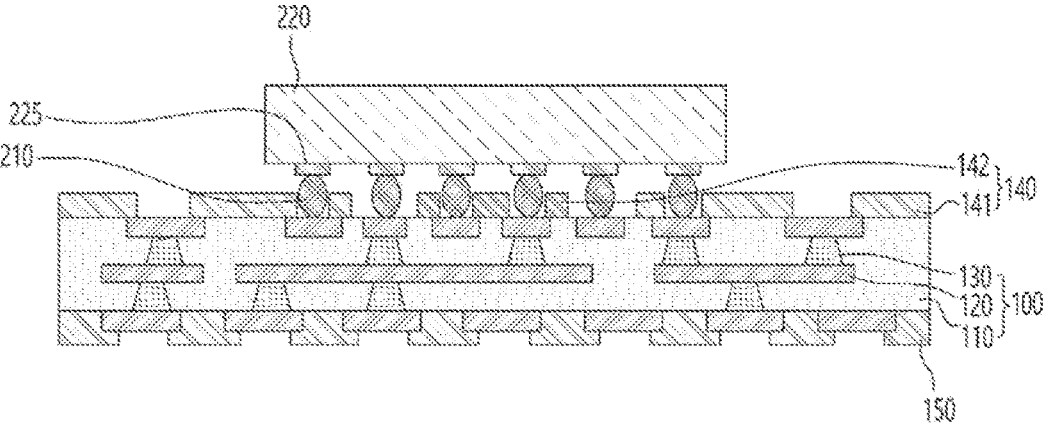
[FIG. 24]
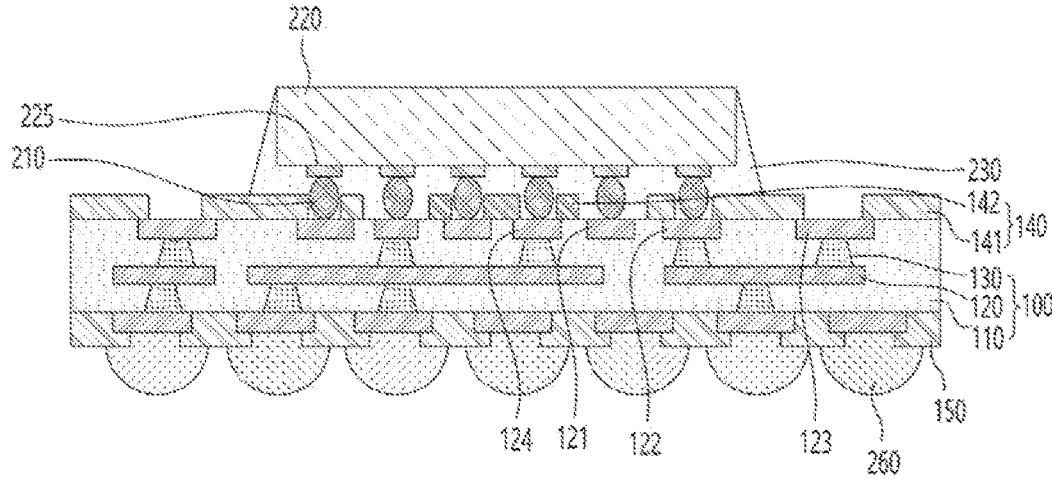

[FIG. 25]
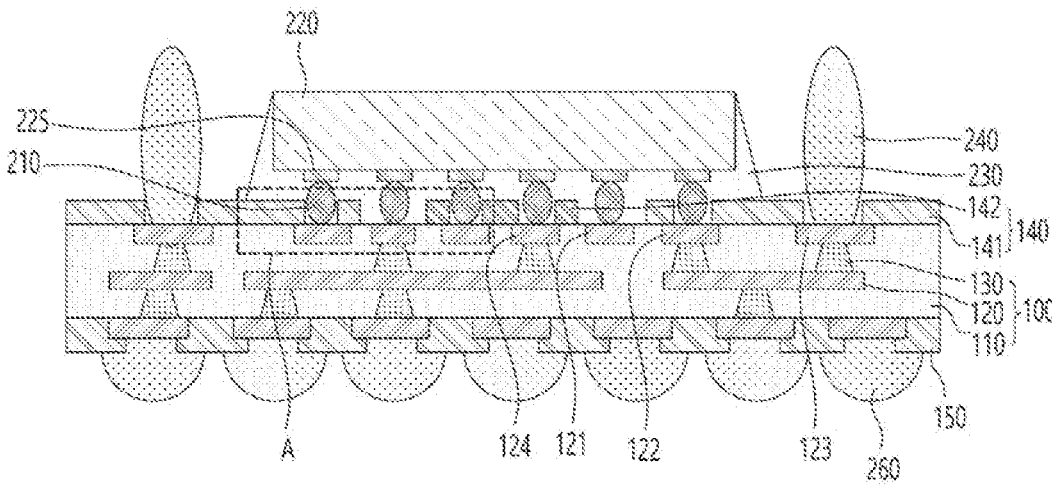
[FIG. 26]
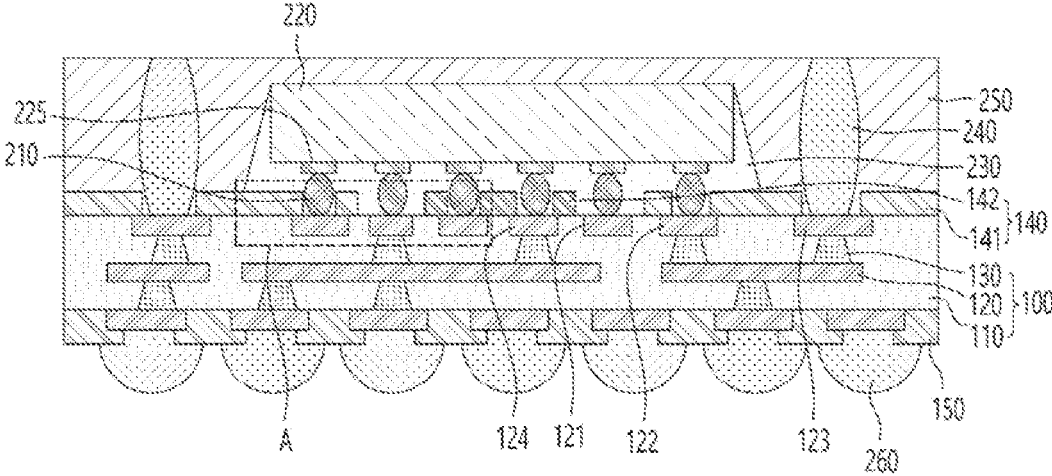

[FIG. 27]
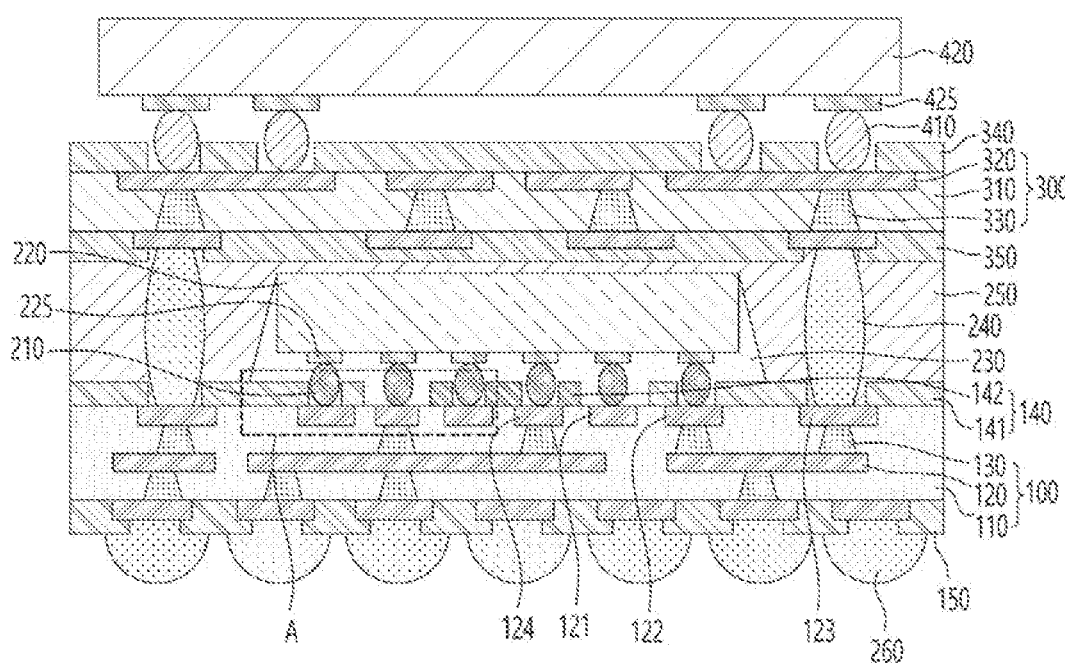

SEMICONDUCTOR PACKAGE

CROSS-REFERENCE TO RELATED APPLICATIONS

The present application claims priority under 35 U.S.C. § 119 and 35 U.S.C. § 365 to Korean Patent Application No. 10-2022-0072782 (filed on Jun. 15, 2022), which is hereby incorporated by reference in its entirety.

BACKGROUND OF THE DISCLOSURE

Field

The embodiment relates to a semiconductor package.

Discussion of the Related Art

High performance of electric/electronic products is progressing, and accordingly, techniques for attaching a larger number of packages to a substrate having a limited size have been proposed and studied. However, a general package basically includes one semiconductor chip, and thus has limitations in having desired performance.

A general semiconductor package includes a processor package having a processor chip and a memory package having a memory chip connected as one. The semiconductor package has advantages of reducing a chip mounting area and enabling high-speed signals through a short pass by manufacturing a processor chip and a memory chip into one integrated package.

The package substrate can provide these advantages and is widely applied to mobile devices and the like.

On the other hand, a size of a package is increasing due to the high specification of electronic devices such as mobile devices and the adoption of High Bandwidth Memory (HBM). Accordingly, a semiconductor package including an interposer is mainly used.

That is, the semiconductor package includes a package substrate, a semiconductor device disposed on the package substrate, and a memory substrate disposed on the package substrate. The memory substrate may be connected through a separate interposer, or the memory substrate may be directly coupled to the package substrate.

In addition, the package substrate includes a mounting pad connected to the semiconductor device and a first protective layer (e.g., a solder resist) including an opening overlapping an upper surface of the mounting pad in a vertical direction.

On the other hand, a number of terminals of the semiconductor device is gradually increasing for reasons such as 5G, Internet of Things (IOT), image quality increase, and communication speed increase. Accordingly, a number of mounting pads included in the package substrate and a number of openings of the first protective layer are also increasing.

In this instance, there is a limit to a minimum size of the opening that can be formed in the first protective layer, and accordingly, there is a problem in that mounting pads connected to terminals of the semiconductor device cannot be disposed within a limited space. Accordingly, a conventional semiconductor package has a problem in that circuit integration density is deteriorated and an overall size is increased.

Accordingly, there is a demand for a semiconductor package including a first protective layer having a novel structure capable of reducing the size of the semiconductor package and arranging all mounting pads connected to terminals of the semiconductor device in a limited space. (Patent Document 1) KR 10-2016-0138753 A

SUMMARY OF THE DISCLOSURE

The embodiment provides a semiconductor package having a novel structure.

In addition, the embodiment provides a semiconductor package including a protective layer having a new open structure.

In addition, the embodiment provides a semiconductor package capable of improving circuit integration density.

In addition, the embodiment provides a semiconductor package with improved physical reliability and electrical reliability.

In addition, the embodiment provides a semiconductor package capable of slimming and miniaturizing.

Technical problems to be solved by the proposed embodiments are not limited to the above-mentioned technical problems, and other technical problems not mentioned may be clearly understood by those skilled in the art to which the embodiments proposed from the following descriptions belong.

A semiconductor package according to an embodiment comprises a substrate; a first protective layer disposed on the substrate and including a through hole; and a second protective layer disposed inside the through hole of the first protective layer and spaced apart from the first protective layer, and wherein an inner surface of the through hole of the first protective layer includes a protrusion surface protruding toward the second protective layer.

In addition, an outer surface of the second protective layer includes a protrusion surface protruding toward the first protective layer.

In addition, the protrusion surface of the first protective layer is provided on an inner corner portion of at least one of an upper surface of the first protective layer and the inner surface of the through hole of the first protective layer.

In addition, a distance in a horizontal direction between the inner surface of the through hole of the first protective layer and an outer surface of the second protective layer includes a different distance along the inner surface of the through hole.

In addition, a separation region is provided between the inner surface of the through hole of the first protective layer and the outer surface of the second protective layer, overlaps with the through hole in a vertical direction and does not overlap with the second protective layer in the vertical direction.

In addition, the separation region has a closed loop shape along the inner surface of the through hole of the first protective layer or the outer surface of the second protective layer.

In addition, the substrate includes an insulating layer; and a circuit layer disposed on the insulating layer; wherein the circuit layer includes a plurality of first electrodes and traces overlapping in the vertical direction with the separation region.

In addition, the separation region includes a first separation region with a first distance; and a second separation region having a second distance smaller than the first distance, and wherein a distance between a plurality of first electrodes and traces overlapping in the vertical direction with the first separation region is smaller than a distance between a plurality of first electrodes and traces overlapping in the vertical direction with the second separation region.

In addition, the first protective layer includes a first opening spaced apart from the through hole and passing through upper and lower surfaces of the first protective layer, wherein the circuit layer further includes a second electrode overlapping the first opening of the first protective layer in the vertical direction.

In addition, the first opening of the first protective layer is disposed adjacent to the first through hole without being connected to the through hole of the first protective layer.

In addition, the second protective layer includes an opening passing through upper and lower surfaces of the second protective layer, and the circuit layer further includes a third electrode overlapping the opening of the second protective layer in the vertical direction.

In addition, a shape of an upper surface of the first electrode is different from a shape of an upper surface of at least one of the second electrode and the third electrode.

In addition, a width of the first electrode in the first horizontal direction is smaller than a width of the second electrode in the first horizontal direction and a width of the third electrode in the first horizontal direction.

In addition, the semiconductor package further comprises a first connection part disposed on the first electrode, the second electrode, and the third electrode; and a semiconductor device disposed on the first connection part.

In addition, at least one of the protrusion surface of the first protective layer and the protrusion surface of the second protective layer has a step in the vertical direction.

In addition, the first protective layer further includes a second opening spaced apart from the through hole and the first opening of the first protective layer and passing through upper and lower surfaces of the first protective layer, and the circuit layer further includes a fourth electrode overlapping the second opening of the first protective layer in the vertical direction.

In addition, the semiconductor package further comprises a second connection part disposed on the fourth electrode; and an external substrate coupled on the second connection part.

In addition, a width of the second opening of the first protective layer is greater than a width of the first opening of the first protective layer; and the second opening of the first protective layer is farther away from the through hole of the first protective layer than the first opening of the first protective layer.

Meanwhile, a semiconductor package according to an embodiment comprises a substrate; a first protective layer disposed on the substrate and including a through hole; a second protective layer disposed inside the through hole of the first protective layer and spaced apart from the first protective layer; and a semiconductor device disposed on the second protective layer; wherein an outer surface of the second protective layer includes a protrusion surface protruding toward the first protective layer, and a distance in a horizontal direction between an inner surface of the through hole of the first protective layer and the outer surface of the second protective layer includes a different distance along the inner surface of the through hole.

In addition, the substrate includes: an insulating layer; and a circuit layer disposed on the insulating layer; wherein the circuit layer includes a first electrode formed in a separation region between the inner surface of the first protective layer and the outer surface of the second protective layer.

Advantageous Effects

A semiconductor package of an embodiment includes a substrate. In addition, the semiconductor package includes a first protective layer disposed on the substrate and having a through hole. In addition, the semiconductor package includes a second protective layer disposed on the substrate and disposed inside the through hole of the first protective layer.

In this case, an inner surface of the first protective layer includes a protrusion surface protruding toward the second protective layer. For example, an outer surface of the second protective layer includes a protrusion surface protruding toward the first protective layer.

Accordingly, a separation distance in a horizontal direction between the inner surface of the through hole of the first protective layer and the outer surface of the second protective layer may include different separation distances along the inner surface of the through hole.

For example, the separation distance may include a first separation distance and a second separation distance. In addition, the first separation distance and the second separation distance may be different from each other. For example, the first separation distance may be greater than the second separation distance.

In this case, first electrodes and traces of a circuit layer of the substrate may be intensively disposed in the first separation region corresponding to the first separation distance rather than in the second separation region corresponding to the second separation distance. For example, a distance between first electrodes and/or traces disposed in the first separation region may be smaller than a distance between first electrodes and/or traces disposed in the second separation region.

This means that the integration density of the circuit layer in the first separation region is higher than the integration density of the circuit layer in the second separation region.

In this case, the first electrodes and the traces may be disposed in the first and second separation regions with the same integration density. However, it may increase the distance between the first electrodes to be connected to each other, thereby increasing the signal transmission loss. Furthermore, when the first electrodes and traces are disposed with the same integration density in the first and second separation regions, an overall area of the separation region may increase because the first electrodes where mutual signal interference occurs should be farther apart. In addition, when the overall area of the separation region increases, the number of electrodes or traces not protected by the first protective layer and the second protective layer increases, and accordingly, it may cause physical reliability and electrical reliability problems.

In addition, first electrodes and traces having different integration densities may be disposed in the first and second separation regions, and the separation distances of the separation regions may be the same along a circumference of the inner surface of the first protective layer. However, it increases the area of electrodes and traces not covered by the first protective layer or the second protective layer, and accordingly, it may cause a problem that the electrode or trace is delaminated due to thermal stress or the like.

Accordingly, the separation region has a first separation distance and a second separation distance different from each other along the circumference of the inner surface of the first protective layer and the outer surface of the second protective layer. Therefore, the embodiment can improve signal transmission characteristics by having different circuit integration densities in the separation region and minimizing signal transmission loss due to a decrease in signal transmission distance. In addition, the embodiment allows a separation distance of a region having a relatively low circuit integration density among the separation regions smaller than a separation distance of a region having a high circuit integration density. Accordingly, the embodiment can minimize a reliability problem due to a trace not being covered by the first protective layer or the second protective layer in a separation region having a small separation distance. Furthermore, the embodiment may further improve electrical reliability and physical reliability of a semiconductor package.

BRIEF DESCRIPTION OF THE DRAWINGS

FIG. 1 is a cross-sectional view illustrating a semiconductor package according to a first embodiment.

FIG. 2 is a cross-sectional view illustrating a semiconductor package according to a second embodiment.

FIG. 3 is a cross-sectional view illustrating a semiconductor package according to a third embodiment.

FIG. 4 is a plan view of a first protective layer of a semiconductor package according to an embodiment.

FIG. 5 is a plan view of a second protective layer of a semiconductor package according to an embodiment.

FIG. 6 is a plan view illustrating a disposition relationship of first and second protective layers of a semiconductor package according to an embodiment.

FIG. 7 is an enlarged view in which a partial region of FIG. 6 is enlarged.

FIG. 8 is a plan view illustrating a circuit layer formed in region A of FIG. 1.

FIG. 9 is a plan view of a state in which a first protective layer and a second protective layer are disposed on the circuit layer of FIG. 8.

FIG. 10 is a cross-sectional view illustrating a protrusion surface of a first protective layer according to a first embodiment.

FIGS. 11a to 11d are cross-sectional views illustrating a protrusion surface of a first protective layer according to a second embodiment.

FIGS. 12a and 12b are cross-sectional views illustrating a protrusion surface of a first protective layer according to a third embodiment.

FIG. 13 is a cross-sectional view illustrating a step structure in a vertical direction of an inner surface of a first protective layer according to a fourth embodiment.

FIGS. 14 to 27 are cross-sectional views illustrating a method of manufacturing a semiconductor package according to an exemplary embodiment in a process order.

DETAILED DESCRIPTION OF THE EMBODIMENTS

Hereinafter, embodiments of the present disclosure will be described in detail with reference to the accompanying drawings.

However, the spirit and scope of the present disclosure is not limited to a part of the embodiments described, and may be implemented in various other forms, and within the spirit and scope of the present disclosure, one or more of the elements of the embodiments may be selectively combined and replaced.

In addition, unless expressly otherwise defined and described, the terms used in the embodiments of the present disclosure (including technical and scientific terms) may be construed the same meaning as commonly understood by one of ordinary skill in the art to which the present disclosure belongs, and the terms such as those defined in commonly used dictionaries may be interpreted as having a meaning that is consistent with their meaning in the context of the relevant art. In addition, the terms used in the embodiments of the present disclosure are for describing the embodiments and are not intended to limit the present disclosure.

In this specification, the singular forms may also include the plural forms unless specifically stated in the phrase, and may include at least one of all combinations that may be combined in A, B, and C when described in "at least one (or more) of A (and), B, and C". Further, in describing the elements of the embodiments of the present disclosure, the terms such as first, second, A, B, (a), and (b) may be used.

These terms are only used to distinguish the elements from other elements, and the terms are not limited to the essence, order, or order of the elements. In addition, when an element is described as being "connected", "coupled", or "contacted" to another element, it may include not only when the element is directly "connected" to, "coupled" to, or "contacted" to other elements, but also when the element is "connected", "coupled", or "contacted" by another element between the element and other elements.

In addition, when described as being formed or disposed "on (over)" or "under (below)" of each element, the "on (over)" or "under (below)" may include not only when two elements are directly connected to each other, but also when one or more other elements are formed or disposed between two elements. Further, when expressed as "on (over)" or "under (below)", it may include not only the upper direction but also the lower direction based on one element.

—Electronic Device—

Before describing an embodiment, an electronic device to which a semiconductor package of the embodiment is applied will be briefly described. An electronic device includes a main board (not shown). The main board may be physically and/or electrically connected to various components. For example, the main board may be connected to the semiconductor package of the embodiment. Various semiconductor devices may be mounted on the semiconductor package.

The semiconductor device may include an active device and/or a passive device. The active device may be a semiconductor device in the form of an integrated circuit (IC) in which hundreds to millions of devices are integrated into a single chip. The semiconductor device may be a logic chip, a memory chip, or the like. The logic chip may be a central processor (CPU), a graphic processor (GPU), or the like. For example, the logic chip may be an application processor (AP) semiconductor device including at least one of a central processor (CPU), a graphic processor (GPU), a digital signal processor, a cryptographic processor, a microprocessor, and a microcontroller, or an analog-to-digital converter, an application-specific IC (ASIC), etc., or a chip set that includes a specific combination of those listed so far.

The memory chip may be a stack memory such as HBM. Also, the memory chip may include a memory chip such as a volatile memory (e.g., DRAM), a non-volatile memory (e.g., ROM), or a flash memory.

On the other hand, a product group to which the semiconductor package of the embodiment is applied include CSP (Chip Scale Package), FC-CSP (Flip Chip-Chip Scale Package), FC-BGA (Flip Chip Ball Grid Array), POP (Package On Package), and SIP (System In Package), but is not limited thereto.

In this case, the electronic device may include a smart phone, a personal digital assistant, a digital video camera, a digital still camera, a network system, a computer, a monitor, a tablet, a laptop, a netbook, a television, a video game, a smart watch, an automotive, and the like. However, the embodiment is not limited thereto, and may be any other electronic device that processes data in addition to these.

—Semiconductor Package—

Hereinafter, a semiconductor package according to an exemplary embodiment will be described.

FIG. 1 is a cross-sectional view illustrating a semiconductor package according to a first embodiment.

Referring to FIG. 1, a semiconductor package includes a substrate 100. The substrate 100 may mean a package substrate.

The substrate 100 may provide a space in which at least one semiconductor device is mounted. Alternatively, the substrate 100 may provide a space to which at least one external substrate is coupled. Since the type of the semiconductor device has already been described above, a detailed description thereof will be omitted. For example, the substrate 100 may provide a space to which a first external substrate is coupled. The first external substrate may refer to a main board included in an electronic device. In addition, the substrate 100 may provide a space to which a second external substrate is coupled. The second external substrate may be an interposer. For example, the second external substrate may be an interposer electrically connecting the semiconductor device and the substrate 100. The interposer may be an active interposer that simultaneously performs a semiconductor device function or a passive interposer that performs only an electrical connection function.

The substrate 100 includes an insulating layer 110, a circuit layer 120 and a through electrode 130.

The insulating layer 110 of the substrate 100 may have a layer structure of at least one layer. Preferably, the insulating layer 110 of the substrate 100 may have a structure in which a plurality of layers are laminated. Through this, the substrate 100 of the embodiment can efficiently electrically connect the main board of the electronic device and the semiconductor device. In this case, the insulating layer 110 of the substrate 100 in FIG. 1 is illustrated as having a three-layer structure, but is not limited thereto. For example, the insulating layer 110 of the substrate 100 may have the number of layers of 2 or less, or may have the number of layers of 4 or more.

When the insulating layer 110 of the substrate 100 has a multi-layer structure, the plurality of insulating layers of the substrate 100 may include the same insulating material, but are not limited thereto. For example, at least one insulating layer among the plurality of insulating layers of the substrate 100 may include an insulating material different from that of the other insulating layer.

For example, the insulating layer 110 may be rigid or flexible. For example, the insulating layer 110 may include glass or plastic. Specifically, the insulating layer 110 may include a chemically tempered/semi-tempered glass, such as soda lime glass, aluminosilicate glass, etc., a tempered or flexible plastic such as polyimide (PI), polyethylene terephthalate (PET), propylene glycol (PPG), polycarbonate (PC), etc., or sapphire. For example, the insulating layer 110 may include an optically isotropic film. For example, the insulating layer 110 of the substrate 100 may include cyclic olefin copolymer (COC), cyclic olefin polymer (COP), optically isotropic PC, optically isotropic polymethylmethacrylate (PMMA), or the like. For example, the insulating layer 110 of the substrate 100 may be formed of a material including an inorganic filler and an insulating resin. For example, the insulating layer 110 of the substrate 100 may have a structure in which an inorganic filler of silica or alumina is disposed in a thermosetting resin or a thermoplastic resin.

For example, the insulating layer 110 of the substrate 100 may be formed of Ajinomoto Build-up Film (ABF), FR-4, Bismaleimide Triazine (BT), Photo Imageable Dielectric Resin (PID), or BT.

In this case, the insulating layer 110 of the substrate 100 in the first embodiment may be composed of ABF (Ajinomoto Build-up Film), which has excellent processability and excellent rigidity and enables slimming of the substrate and refining of the circuit layer 120 of the substrate 100. The ABF (Ajinomoto Build-up Film) does not contain glass fibers. Accordingly, when the insulating layer 110 of the substrate 100 is made of ABF (Ajinomoto Build-up Film), a warpage property of the substrate 100 may be deteriorated.

Therefore, the embodiment may provide the insulating layer 110 of the substrate 100 as ABF (Ajinomoto Build-up Film), and at least one of the plurality of insulating layers of the substrate 100 may include a reinforcing material capable of improving the warpage property.

For example, the insulating layer 110 of the substrate 100 includes a layer composed of a first ABF containing a resin and a filler. In addition, the insulating layer 110 of the substrate 100 includes a layer composed of a second ABF further including a reinforcing material in the first ABF. In this case, the reinforcing material included in the second ABF may be glass fiber, but is not limited thereto.

Each layer of the insulating layer 110 of the substrate 100 may have a thickness ranging from 10 μm to 40 μm. Preferably, each layer of the insulating layer 110 of the substrate 100 may satisfy a thickness ranging from 15 μm to 35 μm. More preferably, each layer of the insulating layer 110 of the substrate 100 may satisfy a thickness ranging from 18 μm to 32 μm.

A thickness of each layer of the insulating layer 110 of the substrate 100 may correspond to a distance between circuit layers disposed on different layers in a vertical direction of the substrate. That is, the thickness may mean a length in a direction from an upper surface to a lower surface of the substrate 100 or in a direction from a lower surface to an upper surface, or may mean a length in a vertical direction of the substrate. Here, the upper surface may mean a highest position of each component along the vertical direction, and a lower surface may mean a lowest position of each component along the vertical direction. And, their positions may be referred to opposite to each other.

When the thickness of each layer of the insulating layer 110 of the substrate 100 is less than 10 μm, the warpage property of the substrate 100 may be deteriorated. In addition, when the thickness of each layer of the insulating layer 110 of the substrate 100 is less than 10 μm, a circuit layer 120 of the substrate 100 is not stably protected, and thus electrical reliability may deteriorate. In addition, when the thickness of each layer of the insulating layer 110 of the substrate 100 exceeds 40 μm, an overall thickness of the substrate 100 increases, and accordingly, a thickness of the semiconductor package may increase. In addition, when the thickness of each layer of the insulating layer 110 of the substrate 100 exceeds 40 μm, it may be difficult to fine the circuit layer 120 of the substrate 100.

Meanwhile, the semiconductor package according to the embodiment includes an upper protective layer 140 including a first protective layer 141 and a second protective layer 142 disposed on the upper surface of the substrate 100. In addition, the semiconductor package includes a lower protective layer 150 disposed under a lower surface of the substrate 100.

The insulating layer 110 of the substrate 100 may include the same insulating material as the upper protective layer 140 including a first protective layer 141 and a second protective layer 142 and the lower protective layer 150. However, it is not limited thereto. In this case, an insulating material of the insulating layer 110 may be different from that of the upper protective layer 140 and the lower protective layer 150.

The insulating layer 110 may include a plurality of layers. Therefore, an upper surface of the insulating layer 110 described below may mean an upper surface of an insulating layer disposed on an uppermost side among the plurality of insulating layers 110. In addition, a lower surface of the insulating layer 110 described below may refer to a lower surface of an insulating layer disposed on a lowermost side among the plurality of insulating layers 110.

The substrate 100 includes a circuit layer 120. The circuit layer 120 may be disposed on a surface of the insulating layer 110 of the substrate 100. For example, when the insulating layer 110 of the substrate 100 has a three-layer structure, the circuit layer 120 may be disposed on each surface of the three insulating layers.

In this case, any one of the circuit layers 120 of the substrate 100 may have an ETS (Embedded Trace Substrate) structure. For example, the circuit layer disposed on an upper surface of the insulating layer 110 of the substrate 100 may have an ETS structure. Accordingly, at least a portion of the circuit layer disposed on an uppermost side of the substrate 100 may be disposed in a groove (not shown) formed on an upper surface of the insulating layer 110. Accordingly, the ETS structure may also be referred to as a buried structure. The ETS structure is advantageous for miniaturization compared to a circuit layer having a general protrusion structure. Therefore, the embodiment may allow the circuit layer disposed on the upper surface of the insulating layer 110 of the substrate 100 to have an ETS structure, so that the circuit layer can be miniaturized. That is, the circuit layer disposed on the upper surface of the insulating layer 110 includes electrodes connected to a semiconductor device or an external substrate. Accordingly, the embodiment enables the formation of the electrodes corresponding to a size and a pitch of the terminals provided in the semiconductor device. Accordingly, the embodiment can improve the circuit integration density. Furthermore, the embodiment can minimize the transmission distance of the signal transmitted through the semiconductor device, so that, it is possible to minimize signal transmission loss.

The circuit layer 120 of the substrate 100 may be formed of at least one metal material selected from among gold (Au), silver (Ag), platinum (Pt), titanium (Ti), tin (Sn), copper (Cu), and zinc (Zn). In addition, the circuit layer 120 of the substrate 100 0 may be formed of paste or solder paste including at least one metal material selected from among gold (Au), silver (Ag), platinum (Pt), titanium (Ti), tin (Sn), copper (Cu), and zinc (Zn), which are excellent in bonding strength. Preferably, the circuit layer 120 of the substrate 100 may be formed of copper (Cu) having high electrical conductivity and a relatively low cost.

The circuit layer 120 of the substrate 100 may have a thickness ranging from 7 µm to 20 µm. For example, the circuit layer 120 of the substrate 100 may have a thickness ranging from 9 µm to 17 µm. The circuit layer 120 of the substrate 100 may have a thickness ranging from 10 µm to 13 µm. When the thickness of the circuit layer 120 of the substrate 100 is less than 7 µm, it may increase a resistance of the circuit layer 120 and decrease an allowable current of transmittable signals. In addition, when the thickness of the circuit layer 120 of the substrate 100 exceeds 20 µm, it may be difficult to miniaturize the circuit layer 120.

The circuit layer 120 of the substrate 100 may include a through pad connected to a through electrode 130 of the substrate 100 and an electrode connected to an external substrate or a semiconductor device. In addition, the circuit layer 120 of the substrate 100 may include traces that are thin and long signal transmission lines connected to the through pads or electrode.

The through pads or electrodes of the circuit layer 120 of the substrate 100 may have a width ranging from 15 µm to 90 µm. The through pads or electrodes of the circuit layer 120 of the substrate 100 may have a width ranging from 20 µm to 85 µm. The through pads or electrodes of the circuit layer 120 of the substrate 100 may have a width ranging from 25 µm to 80 µm.

In this case, the through pads or electrodes of the circuit layer 120 of the substrate 100 may have different widths within the range described above according to their functions. In addition, the electrodes of the circuit layer 120 of the substrate 100 may have different widths corresponding to a size of a terminal of a connected semiconductor device or a size of a pad of an external substrate.

For example, the circuit layer 120 of the substrate 100 may include a plurality of electrodes. For example, the circuit layer 120 of the substrate 100 includes a first electrode 121, a second electrode 122, a third electrode 124 and a fourth electrode 123.

The first electrode 121, the second electrode 122, the third electrode 124, and the fourth electrode 123 are disposed on the same plane of the substrate 100. However, the first electrode 121, the second electrode 122, the third electrode 124 and the fourth electrode 123 may be distinguished from each other according to an arrangement position on the upper surface of the insulating layer 110 of the substrate 100.

The first electrode 121, the second electrode 122, and the third electrode 124 refer to electrodes connected to a terminal 225 of a semiconductor device 220. In this case, the terminal 225 of the semiconductor device 220 is disposed on a lower surface of the semiconductor device 220. The terminal 225 of the semiconductor device 220 may include first to third terminals. The second terminal of the semiconductor device 200 may be disposed adjacent to a side surface of the semiconductor device 200 on a lower surface of the semiconductor device 200. The third terminal of the semiconductor device 200 may be disposed at the center of a lower surface of the semiconductor device. In addition, the first terminal of the semiconductor device 200 may be disposed between the second terminal and the third terminal of the semiconductor device.

In addition, the first electrode 121 of the circuit layer 120 of the substrate 100 is connected to the first terminal of the semiconductor device 220. In addition, the second electrode 122 of the circuit layer 120 of the substrate 100 is connected to the second terminal of the semiconductor device 220. In addition, the third electrode 124 of the circuit layer 120 of the substrate 100 is connected to the third terminal of the semiconductor device 220. In this case, at least one of the first electrode 121, the second electrode 122, and the third electrode 124 may have a different width or shape from at least the other one. For example, the terminal 225 of the semiconductor device 220 may have a different size or pitch depending on an arrangement position. Accordingly, the first electrode 121, the second electrode 122, and the third electrode 124 may have a width or shape corresponding to the size or pitch of the terminal 225 of the semiconductor device 220. This will be described in detail below.

In addition, the fourth electrode 123 of the circuit layer 120 of the substrate 100 may be an electrode connected to an external substrate 300. The external substrate 300 may be a substrate on which the semiconductor device 420 is disposed or an interposer connected to the semiconductor device 420. Accordingly, the fourth electrode 123 of the circuit layer 120 of the substrate 100 may have a larger width than the first electrode 121, the second electrode 122, and the third electrode 124.

The substrate 100 may include a through electrode 130. The through electrode 130 of the substrate 100 may penetrate the insulating layer 110 of the substrate 100. The through electrode 130 of the substrate 100 may connect circuit layers disposed on different insulating layers of the substrate 100.

The through electrode 130 of the substrate 100 may be formed by filling a through hole passing through the insulating layer 110 of the substrate 100 with a conductive material.

The through hole may be formed by any one of mechanical, laser, and chemical processing. When the via hole is formed by mechanical processing, it can be formed using methods such as milling, drilling, and routing. When the through hole is formed by laser processing, it can be formed using methods such as UV or CO2 laser. When the through hole is formed by chemical processing, it can be formed using a chemical containing amino silane, ketones, or the like.

When the through hole is formed, the through electrode 130 of the substrate 100 may be formed by filling the inside of the through hole with a conductive material. The metal material forming the through electrode may be any one material selected from copper (Cu), silver (Ag), tin (Sn), gold (Au), nickel (Ni), and palladium (Pd). In addition, the conductive material filling may use any one or a combination of electroless plating, electrolytic plating, screen printing, sputtering, evaporation, ink-jetting, and dispensing.

The semiconductor package of the first embodiment includes an upper protective layer 140 disposed on the substrate 100. In addition, the semiconductor package includes a lower protective layer 150 disposed under the substrate 100.

The upper protective layer 140 and the lower protective layer 150 may function to protect the substrate 100. For example, the upper protective layer 140 and the lower protective layer 150 may function to protect a surface of the insulating layer 110 or a surface of the circuit layer 120 of the substrate 100. Accordingly, the upper protective layer 140 and the lower protective layer 150 may also be functionally referred to as protective layers.

The upper protective layer 140 and the lower protective layer 150 may be resist layers. Preferably, the upper protective layer 140 and the lower protective layer 150 may be a solder resist layer containing organic polymer materials. For example, the upper protective layer 140 and the lower protective layer 150 may include an epoxy acrylate-based resin. In detail, the upper protective layer 140 and the lower protective layer 150 may include a resin, a curing agent, a photo initiator, a pigment, a solvent, a filler, an additive, an acrylic monomer, and the like. However, the embodiment is not limited thereto, and the upper protective layer 140 and the lower protective layer 150 may be any one of a photo solder resist layer, a cover-lay, and a polymer material.

Each of the upper protective layer 140 and the lower protective layer 150 may have a thickness of 1 μm to 20 μm. Each of the upper protective layer 140 and the lower protective layer 150 may have a thickness of 1 μm to 15 μm. For example, each thickness of the upper protective layer 140 and the lower protective layer 150 may be 5 μm to 20 μm. When the thickness of each of the upper protective layer 140 and the lower protective layer 150 exceeds 20 μm, it can increase the thickness of the semiconductor package or apply stress to the substrate 100. When the thickness of each of the upper protective layer 140 and the lower protective layer 150 is less than 1 μm, the circuit layer 120 included in the substrate 100 is not stably protected, and it can degrade electrical reliability or physical reliability.

The upper protective layer 140 may include a first protective layer 141 and a second protective layer 142. The first protective layer 141 and the second protective layer 142 may be distinguished according to an arrangement position on the substrate 100. The first protective layer 141 and the second protective layer 142 may be one layer distinguished according to the arrangement position, or may mean layers separated or separated from each other. Here, the distinction of one layer according to the arrangement position may mean that the first protective layer 141 and the second protective layer 142 may be made of the same material and may have the same thickness.

The first protective layer 141 may include a plurality of open regions. For example, the first protective layer 141 includes an upper surface and a lower surface opposite to the upper surface. In addition, the first protective layer 141 may include a plurality of open regions passing through the upper and lower surfaces of the first protective layer 141 at different positions. The plurality of open regions of the first protective layer 141 may be distinguished into a through hole and an opening. The division between the through hole and the opening may be made by size, shape, and number of exposed electrodes.

For example, the first protective layer 141 may include a through hole 141T1 (see FIG. 4). In addition, the first protective layer 141 may include a first opening 141T2 (see FIG. 4) and a second opening 141T3 (see FIG. 4) spaced apart from the through hole 141T1.

The through hole 141T1 of the first protective layer 141 may have a planar shape different from that of the first opening 141T2 and the second opening 141T3 of the first protective layer 141. A planar shape of the through hole 141T1 of the first protective layer 141 may correspond to a planar shape of the semiconductor device 220. For example, the planar shape of the through hole 141T1 of the first protective layer 141 may be a square shape, but is not limited thereto. In addition, the first opening 141T2 and the second opening 141T3 of the first protective layer 141 may have a planar shape corresponding to a planar shape of the second electrode 122 and the fourth electrode 123 of the circuit layer 120 of the substrate 100. For example, planar shapes of the first opening 141T2 and the second opening 141T3 of the first protective layer 141 may be circular, but are not limited thereto.

A size of the through hole 141T1 of the first protective layer 141 may be larger than a size of each of the first opening 141T2 and the second opening 141T3 of the first protective layer 141. The size may mean an area, and may mean a width in a first horizontal direction and/or a second horizontal direction. The size of the through hole 141T1 of the first protective layer 141 may be determined by a size of the semiconductor device 220. Also, the sizes of the first opening 141T2 and the second opening 141T3 of the first protective layer 141 may be determined by the sizes of the second electrode 122 and the fourth electrode 123.

In addition, the through hole 141T1 of the first protective layer 141 may overlap a plurality of electrodes of the circuit layer 120 of the substrate 100 in a vertical direction. For example, the circuit layer 120 of the substrate 100 includes a plurality of first electrodes, a plurality of second electrodes, and a plurality of third electrodes. The through hole 141T1 of the first protective layer 141 overlaps the plurality of first electrodes and the plurality of third electrodes in a vertical direction. That is, the through-hole 141T1 of the first protective layer 141 means one hole, and accordingly, the through hole 141T1 may overlap in a vertical direction in common with a plurality of first electrodes, a plurality of third electrodes, and a trace disposed between the plurality of first electrodes and the plurality of third electrodes.

In addition, the first opening 141T2 of the first protective layer 141 may overlap the second electrode 122 of the circuit layer 120 of the substrate 100 in a vertical direction. For example, the first opening 141T2 of the first protective layer 141 may partially overlap an upper surface of one second electrode 122 in a vertical direction. In addition, the second opening 141T3 of the first protective layer 141 may overlap the fourth electrode 123 of the circuit layer 120 of the substrate 100 in a vertical direction. For example, the second opening 141T3 of the first protective layer 141 may partially overlap an upper surface of one fourth electrode 123 in a vertical direction.

Each of the first opening 141T2 and the second opening 141T3 may be provided to expose one pad, and the through hole 141T1 may be provided to expose a plurality of pads. Here, the pad may refer to a region where the circuit layer and the semiconductor device are coupled, or may mean a metal disposed on the circuit layer to couple the semiconductor device and the circuit layer. Coupling of a semiconductor device and a circuit layer may mean wire bonding, solder bonding, direct bonding between metals, and the like. The wire bonding may refer to electrically coupling a terminal 225 of a semiconductor device and a circuit layer using a conductive wire such as gold (Au). In addition, the solder bonding may refer to electrically coupling a semiconductor device and a circuit layer using a material including at least one of Sn, Ag, and Cu. In addition, the direct bonding between metals may mean direct coupling between the circuit layer and the terminal 225 of the semiconductor element by recrystallization by applying heat and pressure to the circuit layer and the terminal 225 of the semiconductor element without solder, wire, conductive adhesive, or the like. Here, the pad may be interpreted as meaning a portion where the terminal 225 of the semiconductor device and the circuit layer are coupled. Accordingly, the pad may refer to a partial region of the upper surface of the circuit layer, or may refer to a metal layer disposed on the upper surface of the circuit layer as a metal coupled to the terminal 225 of the semiconductor device.

In addition, the second protective layer 142 may be disposed inside the through hole 141T1 of the first protective layer 141. For example, the second protective layer 142 may be disposed in a region vertically overlapping the through hole 141T1 of the first protective layer 141 on the upper surface of the substrate 100. The second protective layer 142 may include an opening 142T. The opening 142T of the second protective layer 142 may overlap the third electrode 124 of the circuit layer 120 of the substrate 100 in a vertical direction. For example, the opening 142T of the second protective layer 142 may partially overlap the upper surface of the third electrode 124 in a vertical direction.

An area of the second protective layer 142 is smaller than an area of the through hole 141T1 of the first protective layer 141. Accordingly, a separation region (SA, see FIG. 6) may be provided between an inner surface of the through hole 141T1 of the first protective layer 141 and the outer surface of the second protective layer 142 in a state where the second protective layer 142 is disposed inside the through hole 141T1 of the first protective layer 141. In addition, the separation region SA refers to a region that overlaps with the through hole 141T1 of the first protective layer 141 in a vertical direction and does not overlap with the second protective layer 142 in a vertical direction. In addition, at least a portion of the first electrode 121 of the circuit layer 120 of the substrate 100 may overlap the separation region SA in a vertical direction.

Specific structures of the first protective layer 141 and the second protective layer 142 of the upper protective layer 140 will be described in more detail below.

Meanwhile, the lower protective layer 150 may also include an opening. The opening of the lower protective layer 150 may vertically overlap the fifth electrode disposed on the lower surface of the insulating layer 110 of the substrate 100. The lower protective layer 150 may not include the through hole provided in the upper protective layer 140 but may include only an opening.

A semiconductor package according to an embodiment includes a first connection part 210. That is, a first connection part 210 is disposed on the substrate 100. For example, a first connection part 210 is disposed on the first electrode 121, the second electrode 122, and the third electrode 124 of the circuit layer 120 of the substrate 100.

Specifically, the first connection part 210 may be disposed in the first opening 141T2 of the first protective layer 141, the opening 142T of the second protective layer 142, and the separation region (SA) between the first protective layer 141 and the second protective layer 142.

The first connection part 210 may have a hexahedral shape. A cross section of the first connection part 210 may have a rectangular shape. A cross section of the first connection part 210 may include a rectangle or a square. For example, the first connection part 210 may have a spherical shape. For example, the cross section of the first connection part 210 may include a circular shape or a semicircular shape. For example, a cross section of the first connection part 210 may include a partially or entirely rounded shape. A cross-sectional shape of the first connection part 210 may be a flat surface on one side and a curved surface on the other side. The first connection part 210 may be a solder ball, but is not limited thereto.

The semiconductor package of the embodiment includes a component disposed on the first connection part 210. The component disposed on the first connection part 210 may be a semiconductor device, or alternatively may be an interposer. Hereinafter, a component disposed on the first connection part 210 will be described as being the semiconductor device 220.

The semiconductor device 220 may be a logic chip, but is not limited thereto. For example, the semiconductor device 220 may be an application processor (AP) chip any one of a central processor (e.g., CPU), a graphic processor (e.g., GPU), a digital signal processor, a cryptographic processor, a microprocessor, and a microcontroller. The semiconductor device 220 includes a terminal 225 on a lower surface. In addition, the terminal 225 of the semiconductor device 220 may be electrically connected to the first electrode 121, the second electrode 122 and the third electrode 124 of the circuit layer 120 of the substrate 100 through the first connection part 210.

In addition, the semiconductor package may include an underfill 230. The underfill 230 is disposed on the substrate 100. The underfill 230 may be disposed on the substrate 100 while covering the periphery of the semiconductor device 220. The underfill 230 may be disposed on a portion of the upper surface of the first protective layer 141 and a portion of the upper surface of the second protective layer 142, and may be disposed in a portion of the open region of the first protective layer 141 and a portion of the open region of the second protective layer 142. The underfill 230 may cover the terminal 225 of the semiconductor device 220, the first connection part 210, and electrodes of the circuit layer 120. The underfill 230 may be formed to improve junction reliability between the terminal 225 of the semiconductor device 220 and the electrodes of the circuit layer 120.

The semiconductor package may include a second connection part 240. The second connection part 240 may be disposed on the fourth electrode 123 of the circuit layer 120 of the substrate 100. For example, the second connection part 240 may be disposed in the second opening 141T3 of the first protective layer 141 overlapping the fourth electrode 123 in a vertical direction. The second connection part 240 may be a bump. For example, the second connection part 240 may be a solder bump, but is not limited thereto. For example, the second connection part 240 may be a post bump. For example, the second connection part 240 may include a copper post and a solder bump disposed on the copper post. An upper surface of the second connection part 240 may be positioned higher than an upper surface of the semiconductor device 220. Through this, it is possible to prevent the semiconductor device 220 from being damaged during a coupling process of the external substrate 300 disposed on the second connection part 240.

Referring to FIG. 2, the semiconductor package may have a package-on-package structure. That is, a semiconductor package may have a structure in which another semiconductor package is disposed and electrically connected in a vertical direction. However, the present invention is not limited thereto, and an active interposer 420 may be disposed on a semiconductor device and electrically connected to the second connection part 240. Although not shown in the drawing, the active interposer 420 may have a structure directly connected to the semiconductor device 220 and the second connection part 240. Accordingly, it can facilitate power supply or electrical signal connection.

The semiconductor package may include a molding layer 250. The molding layer 250 may be disposed on the substrate 100 and the upper protective layer 140. The molding layer 250 may mold the second connection part 240, the underfill 230, and the semiconductor device 220.

The molding layer 250 may be EMC (Epoxy Mold Compound), but is not limited thereto. The molding layer 250 may have a low dielectric constant. For example, the dielectric constant (Dk) of the molding layer 250 may be 0.2 to 10. For example, the dielectric constant (Dk) of the molding layer 250 may be 0.5 to 8. For example, the dielectric constant (Dk) of the molding layer 250 may be 0.8 to 5. Accordingly, the molding layer 250 may have a low dielectric constant, so that it can improve heat dissipation property of heat generated from the semiconductor device 220. The molding layer 250 may include an opening. For example, the molding layer 250 may include an opening overlapping the upper surface of the second connection part 240 in a vertical direction.

The semiconductor package includes a third connection part 260.

The third connection part 260 may be disposed under a lower surface of the substrate 100. For example, the third connection part 260 may be disposed under a lower surface of the fifth electrode of the circuit layer 120 disposed under the lower surface of the substrate 100. For example, the third connection part 260 may be disposed in the opening of the lower protective layer 150. The third connection part 260 may be a solder for connecting the semiconductor package of the embodiment to a separate external substrate (e.g., a main board of an electronic device), but is not limited thereto.

The semiconductor package includes an external substrate 300. The external substrate 300 may mean a separate substrate coupled to the substrate 100. For example, the semiconductor device 220 disposed on the substrate 100 may be a logic chip such as a CPU or a GPU, and the external substrate 300 may be a memory substrate on which a memory chip connected to the logic chip is disposed. The external substrate 300 may be an interposer connecting a memory substrate on which a semiconductor device 420 corresponding to a memory chip is disposed and the substrate 100.

The external substrate 300 may include an insulating layer 310, a circuit layer 320 and a through electrode 330. In addition, the semiconductor package may include an upper insulating layer 340 disposed on an upper surface of the external substrate 300 and a lower insulating layer 350 disposed on a lower surface of the external substrate 300.

The semiconductor package may include a fourth connection part 410. The fourth connection part 410 may be disposed on the external substrate 300.

The semiconductor package may include a semiconductor device 420. The semiconductor device 420 may be mounted on the external substrate 300 through the fourth connection part 410. The semiconductor device 420 may be a memory chip, but is not limited thereto.

FIG. 2 is a cross-sectional view illustrating a semiconductor package according to a second embodiment.

Referring to FIG. 2, the semiconductor package of the second embodiment may be different from the semiconductor package of the first embodiment in a structure of the substrate 100. Therefore, only the structure of the substrate 100 will be described below.

The semiconductor package of the first embodiment of FIG. 1 may be a core-less substrate. In addition, the semiconductor package of the second embodiment of FIG. 2 may be a core substrate.

Referring to FIG. 2, the substrate 100 includes an insulating layer 110. In addition, the insulating layer 110 may have a multi-layer structure. The insulating layer 110 may include a core layer 111. The core layer 111 may include prepreg. The prepreg may be formed by impregnating a fiber layer in the form of a fabric sheet, such as a glass fabric woven with glass yarn, with an epoxy resin, and then performing thermal compression. The core layer 111 may include a resin and reinforcing fibers disposed in the resin. The resin may be an epoxy resin, but is not limited thereto.

The insulating layer 110 of the substrate 100 may further include an additional insulating layer 112 disposed on the core layer 111. The additional insulating layer 112 may be ABF that does not include a reinforcing material included in the substrate 100 of the first embodiment.

In this case, the electrodes of the circuit layer 120 of the substrate 100 according to the second embodiment may have a structure protruding above an upper surface of the insulating layer 110 of the substrate 100.

FIG. 3 is a cross-sectional view illustrating a semiconductor package according to a third embodiment.

Referring to FIG. 3, the semiconductor package of the third embodiment may differ from the semiconductor package of the first embodiment in a configuration of semiconductor devices disposed on the substrate 100. Therefore, only the configuration of the semiconductor device disposed on the substrate 100 will be described below.

The semiconductor package of the third embodiment may include a first component 220 disposed on the first connection part 210 of the substrate 100. The first component 220 may be a semiconductor device, or alternatively, may be an interposer. In addition, when the first component 220 is an interposer, it may be an active interposer, and alternatively, may be a passive interposer.

In addition, the semiconductor package of the third embodiment may include a fifth connection part 510 disposed on the first component 220. The fifth connection part 510 may be electrically connected to the first component 220. For example, when the first component 220 is a semiconductor device, the fifth connection part 510 may be disposed on a terminal of the semiconductor device. For example, when the first component 220 is an interposer, the fifth connection part 510 may be disposed on an electrode of the interposer.

In addition, the semiconductor package of the third embodiment may include a second component 520 disposed on the fifth connection part 510. The second component 520 may be a semiconductor device. For example, the second component 520 may be a CPU or a GPU, but is not limited thereto. The second component 520 includes a terminal 525. In addition, the terminal 525 of the second component 520 may be electrically connected to the first component 220 through the fifth connection part 510. Accordingly, the second component 520 may be electrically connected to the substrate 100.

For example, a plurality of semiconductor devices 220 and 520 may be disposed on the substrate 100 in a stacked structure in the semiconductor package of the third embodiment. In addition, the substrate 100 and the semiconductor device 520 may be electrically connected through an active or passive interposer 220 in the semiconductor package of the third embodiment.

Although not shown in the semiconductor package of FIG. 3, the semiconductor package of the third embodiment may include the second connection part 240, the molding layer 250, the underfill 230, the external substrate 300, and the semiconductor device 420 shown in FIG. 1.

Hereinafter, a structure of the electrodes of the circuit layer 120 of the substrate 100 of the embodiment and a structure of the open regions of the first protective layer 141 and the second protective layer 142 disposed on the substrate 100 will be described in detail.

FIG. 4 is a plan view of a first protective layer of a semiconductor package according to an embodiment, FIG. 5 is a plan view of a second protective layer of a semiconductor package according to an embodiment, FIG. 6 is a plan view illustrating a disposition relationship of first and second protective layers of a semiconductor package according to an embodiment, and FIG. 7 is an enlarged view in which a partial region of FIG. 6 is enlarged. In this case, FIG. 6 may be a plan view in a state in which the second protective layer 142 of FIG. 5 is disposed in the through hole 141T1 of the first protective layer 141 of FIG. 4.

Referring to FIG. 4, a first protective layer 141 is disposed on the substrate 100. The first protective layer 141 includes an open region. The first protective layer 141 includes a plurality of through-hole type open regions passing through upper and lower surfaces.

The first protective layer 141 includes a through hole 141T1 vertically overlapping with the semiconductor device 220 disposed on the substrate 100. The shape and size of the through hole 141T1 of the first protective layer 141 may correspond to the shape and size of the semiconductor device 220.

For example, when a planar shape of the semiconductor device 220 is a square shape, a planar shape of the through hole 141T1 of the first protective layer 141 may have a square shape.

In addition, the size or area of the through hole 141T1 of the first protective layer 141 may correspond to the size or area of a lower surface of the semiconductor device 220. For example, the size or area of the through hole 141T1 of the first protective layer 141 may be 60% or more, 70% or more, or 80% or more of the size or area of the lower surface of the semiconductor device 220. In addition, the size or area of the through hole 141T1 of the first protective layer 141 may be smaller than the size or area of the lower surface of the semiconductor device 220. Accordingly, at least a portion of an upper surface of the first protective layer 141 may overlap the semiconductor device 220 in a vertical direction.

An upper surface of the first protective layer 141 may have a step in a horizontal direction in a region where the through hole 141T1 is provided. That is, the upper surface of the first protective layer 141 may include inner corner portions 141P and 141C to define the through hole 141T1. The inner corner portions 141P and 141C may have a step in a horizontal direction. For example, the inner corner portions 141P and 141C may be distinguished into a protrusion surface 141P and a concave surface 141C having a step in a horizontal direction. In addition, the protrusion surface 141P and the concave surface 141C may be provided on an inner corner portion of an upper surface of the first protective layer 141 including the through hole 141T1, or alternatively may be provided on an inner corner portion of an inner surface of the first protective layer 141.

That is, FIG. 4 shows inner corner portions 141P and 141C having a stepped structure defining the through hole 141T1 of the first protective layer 141.

In this case, the inner corner portions 141P and 141C may represent an upper surface of the first protective layer 141 defining the through hole 141T, and may have a step in a horizontal direction. In this case, an inner surface of the first protective layer 141 defining the through hole 141 may not have a step.

Alternatively, the inner corner portions 141P and 141C may represent the inner surface of the first protective layer 141 defining the through hole 141T, and may have a step along the horizontal direction. In this case, the upper surface of the first protective layer 141 defining the through hole 141 may not have a step.

Alternatively, the inner corner portions 141P and 141C may be formed by a combination of an upper surface and an inner surface of the first protective layer 141 defining the through hole 141T, and may have a step in the horizontal direction. In other words, each of the upper surface and the inner surface of the first protective layer 141 defining the through hole 141 may have a step in a horizontal direction.

Hereinafter, it is assumed that the inner corners 141P and 141C are the inner surface of the first protective layer 141 defining the through hole 141T. However, the embodiment is not limited thereto, and the protrusion surface 141C and the concave surface 141C constituting the inner corner portions 141 and 141C described below may mean an upper surface of the first protective layer 141 instead of the inner surface.

An inner surface of the through hole 141T1 of the first protective layer 141 may have a step in a horizontal direction. For example, an inner surface of the through hole 141T1 of the first protective layer 141 may include a protrusion surface 141P protruding in a direction away from the inner surface. For example, an inner surface of the through hole 141T1 of the first protective layer 141 may include a concave surface 141C recessed inward of the first protective layer 141.

For example, the inner surface of the through hole 141T1 of the first protective layer 141 may include a protrusion surface 141P, and a portion of the inner surface excluding the protrusion surface 141P may be referred to as a concave surface 141C. Alternatively, the inner surface of the through hole 141T1 of the first protective layer 141 may include a concave surface 141C, and a portion of the inner surface excluding the concave surface 141C may be referred to as a protrusion surface 141P.

In addition, the inner surface of the through hole 141T1 of the first protective layer 141 may include a plurality of protrusion surfaces having different protrusion distances in a direction away from the inner surface. Accordingly, the plurality of protrusion surfaces may have a step along a circumferential direction of the inner surface. That is, the fact that the inner surface of the through hole 141T1 of the first protective layer 141 has a step along the circumferential direction of the inner surface may mean a step by a plurality of protrusion surfaces having different protrusion distances, or may mean a step by a plurality of concave surfaces having different concave distances.

In this case, when a cross-sectional shape of the through hole 141T1 has a square shape, the inner surface of the first protective layer 141 of the through hole 141T1 may have four inner surfaces respectively corresponding to four sides. In addition, the protrusion surface 141P and the concave surface 141C may be formed on at least one inner surface among the four inner surfaces.

In this case, an outer surface of the first protective layer 141 does not have a step. Accordingly, the fact that the inner surface of the first protective layer 141 has a step may mean that a horizontal distance between the outer and inner surfaces of the first protective layer 141 that correspond to each other is different along the circumference of the inner surface of the first protective layer 141.

On the other hand, it is described that the inner surface of the through hole 141T1 of the first protective layer 141 includes a protrusion surface 141P and a concave surface 141C that protrude or concave in a horizontal direction along the circumferential direction of the inner surface, but is not limited thereto. For example, the protrusion surface 141P and the concave surface 141C of the inner surface of the first protective layer 141 may have a vertically stepped structure. This will be described in more detail below.

Meanwhile, it is described that the inner surface of the through hole 141T1 of the first protective layer 141 of the embodiment includes the protrusion surface 141P and the concave surface 141C, but is not limited thereto.

For example, the inner surface of the first protective layer 141 may include a reference surface and at least one protrusion surface protruding in a horizontal direction from the reference surface. In this case, the reference surface may also be referred to as a concave surface of the inner surface of the first protective layer 141.

For example, the inner surface of the first protective layer 141 may include a reference surface and at least one concave surface recessed inward from the reference surface toward an outer surface of the first protective layer 141. In this case, the reference surface may also be referred to as the protrusion surface of the inner surface of the first protective layer 141.

For example, the inner surface of the first protective layer 141 may include a reference surface, a protrusion surface protruding from the reference surface, and a concave surface recessed from the reference surface.

In addition, the through hole 141T1 of the first protective layer 141 may overlap a plurality of electrodes of the circuit layer 120 of the substrate 100 in a vertical direction. For example, the circuit layer 120 of the substrate 100 includes a plurality of first electrodes, a plurality of second electrodes, and a plurality of third electrodes. The through hole 141T1 of the first protective layer 141 overlaps the plurality of second electrodes and the plurality of third electrodes in a vertical direction. That is, the through-hole 141T1 of the first protective layer 141 means one hole, and the through hole 141T1 may overlap in a vertical direction in common with a plurality of first electrodes, a plurality of third electrodes, and a trace disposed between the plurality of first electrodes and the plurality of third electrodes.

The first protective layer 141 may include a plurality of openings. For example, the first protective layer 141 may include a plurality of first openings 141T2 and a plurality of second openings 141T3. The first opening 141T2, the second opening 141T3, and the through hole 141T1 are substantially the same in that it pass through the first protective layer 141, but it can be distinguished from each other by at least one of its position, size and shape.

The first protective layer 141 may include a plurality of first openings 141T2. The plurality of first openings 141T2 may pass through the first protective layer 141 in a region adjacent to the through hole 141T1. The first opening 141T2 is not connected to the through hole 141T1. For example, the first opening 141T2 may pass through the first protective layer 141 at a position spaced apart from the through hole 141T1. However, the embodiment is not limited thereto. For example, a plurality of first openings 141T2 may be formed, and at least one of the plurality of first openings may be connected to the through hole 141T1.

The first opening 141T2 may be formed adjacent to a plurality of inner surfaces of the through hole 141T1 of the first protective layer 141. For example, the first opening 141T2 may be formed adjacent to each of first to fourth inner surfaces of the first protective layer 141. For example, the first protective layer 141 may have one through hole 141T1 and thus have one inner surface connected to each other. In addition, one inner surface of the through hole 141T1 of the first protective layer 141 may be divided into first to fourth inner surfaces according to positions. A size and/or shape of the first opening 141T2 may correspond to a size and/or shape of the second electrode 122 of the substrate 100.

In this case, the first opening 141T2 may partially overlap an upper surface of the second electrode 122 in a vertical direction. For example, a portion of an upper surface of the second electrode 122 overlaps the first opening 141T2 of the first protective layer 141 in a vertical direction, and the remaining portion of an upper surface of the second electrode 122 may be covered with the first protective layer 141. For example, the first opening 141T2 of the first protective layer 141 may be a solder mask defined (SMD) type opening, but is not limited thereto. For example, the first opening 141T2 of the first protective layer 141 may be a non-solder mask defined (NSMD) type opening.

The first protective layer 141 may further include a second opening 141T3. The second opening 141T3 of the first protective layer 141 may pass through the first protective layer 141 at a position spaced apart from the through hole 141T1 and the first opening 141T2.

Preferably, the second opening 141T3 of the first protective layer 141 may pass through upper and lower surfaces of the first protective layer 141 in an outer region of the upper surface of the first protective layer 141.

A width of the second opening 141T3 of the first protective layer 141 may be greater than that of the first opening 141T2. For example, a width of the second electrode 122 of the circuit layer 120 of the substrate 100 may be smaller than a width of the fourth electrode 123. Accordingly, a width of the first opening 141T2 of the first protective layer 141 may be smaller than that of the second opening 141T3.

Meanwhile, the through hole 141T1 of the first protective layer 141 may be referred to as a region where the second protective layer 142 and the first connection part 210 are disposed. In addition, the first opening 141T2 of the first protective layer 141 may be referred to as a region where the first connection part 210 is disposed. In addition, the second opening 141T3 of the first protective layer 141 may be referred to as a region where the second connection part 240 is disposed.

Meanwhile, referring to FIG. 5, the second protective layer 142 may include a plurality of openings 142T. The plurality of openings 142T of the second protective layer 142 may overlap the through hole 141T1 of the first protective layer 141 in a vertical direction. The plurality of openings 142T of the second protective layer 142 may overlap a third electrode 124 of the circuit layer 120 of the substrate 100 in a vertical direction. The third electrode 124 of the circuit layer 120 of the substrate 100 may be provided in plurality. formed. Accordingly, an opening 142T of the second protective layer 142 may include a plurality of openings spaced apart from each other corresponding to the third electrode 124.

The opening 142T of the second protective layer 142 may overlap the third electrode 124 of the circuit layer 120 in a vertical direction. The opening 142T of the second protective layer 142 may partially overlap an upper surface of the third electrode 124 in a vertical direction. For example, a portion of the upper surface of the third electrode 124 may overlap the opening 142T of the second protective layer 142 in a vertical direction, and the remaining portion of the upper surface of the third electrode 124 may be covered with the second protective layer 142. For example, the opening 142T of the second protective layer 142 may be a SMD (Solder Mask Defined) type opening, but is not limited thereto. For example, the opening 142T of the second protective layer 142 may be a non-solder mask defined (NSMD) type opening.

Meanwhile, an upper surface of the first protective layer 141 and an upper surface of the second protective layer 142 may be positioned on the same plane.

For example, a lower surface of the first protective layer 141 and a lower surface of the second protective layer 142 may be positioned on the same plane.

In other words, the first protective layer 141 and the second protective layer 142 may be disposed at different positions in an upper region of the substrate 100 to have the same thickness, but the embodiment is not limited thereto.

For example, the first protective layer 141 and the second protective layer 142 may have different thicknesses. For example, a thickness of the second protective layer 142 may be smaller than that of the first protective layer 141. For example, an upper surface of the second protective layer 142 may be positioned lower than an upper surface of the circuit layer 120. For example, an upper surface of the second protective layer 142 may be positioned lower than an upper surface of the third electrode 124 of the circuit layer 120.

That is, the second protective layer 142 may be disposed only in a region between the plurality of third electrodes 124 on the insulating layer 110 of the substrate 100. For example, the second protective layer 142 may not overlap a plurality of electrodes disposed on an upper surface of the insulating layer 110 of the substrate 100 in a vertical direction.

An outer surface of the second protective layer 142 may include at least one of a protrusion surface 142P and a concave surface 142C. For example, when an outer surface of the second protective layer 142 includes the protrusion surface 142P, the remaining outer surface excluding the protrusion surface 142P may also be referred to as a concave surface. For example, when the outer surface of the second protective layer 142 includes a concave surface, the remaining outer surface excluding the concave surface 142C may be referred to as a protrusion surface.

An outer surface of the second protective layer 142 may face an inner surface of the first protective layer 141 in a horizontal direction.

In this case, a part of the protrusion surface 141P of the inner surface of the first protective layer 141 may overlap a part of the protrusion surface 142P of the outer surface of the second protective layer 142 in a horizontal direction, and the remaining part of the protrusion surface 141P of the inner surface of the first protective layer 141 may overlap a part of the concave surface 142C of the outer surface of the second protective layer 142 in a horizontal direction.

In addition, a part of the concave surface 141C of the inner surface of the first protective layer 141 may overlap a part of the protrusion surface 142P of the outer surface of the second protective layer 142 in a horizontal direction, and the remaining part of the concave surface 141C of the inner surface of the first protective layer 141 may overlap a part of the concave surface 142C of the outer surface of the second protective layer 142 in a horizontal direction.

Meanwhile, referring to FIG. 6, the first protective layer 141 includes a through hole 141T1. In addition, the second protective layer 142 is disposed inside the through hole 141T1 of the first protective layer 141.

In this case, a plane area of the through hole 141T1 of the first protective layer 141 is greater than that of the second protective layer 142. In addition, the first protective layer 141 does not contact the second protective layer 142.

Therefore, a separation region (SA) is provided between the inner surface of the through hole 141T1 of the first protective layer 141 and the outer surface of the second protective layer 142 in a state where the second protective layer 142 is disposed inside the through hole 141T1 of the first protective layer 141.

The separation region SA may refer to a region that does not overlap with the second protective layer 142 in the vertical direction in a region area of the through hole 141T1 of the first protective layer 141. Accordingly, the separation region SA may have a closed loop shape between the inner surface of the first protective layer 141 and the outer surface of the second protective layer 142. Accordingly, it is possible to prevent an electrical short circuit with a circuit layer positioned in a region adjacent to the separation region (SA), and to serve as an alignment key for arranging a semiconductor device, thereby improving process yield. In addition, the embodiment can control a stress applied to the substrate by the first protective layer 141 and the second protective layer 142, so that it can improve the mechanical reliability of a semiconductor device package.

In addition, a separation distance in a horizontal direction of the first protective layer 141 and the second protective layer 142 may include a first separation distance and a second separation distance different from each other along the outer surface of the second protective layer 142. The separation distance may mean a separation distance in a first horizontal direction between the outer surface of the second protective layer 142 and the inner surface of the first protective layer 141 along a circumference of the outer surface of the second protective layer 142. Alternatively, the separation distance may mean a separation distance in a second horizontal direction perpendicular to the first horizontal direction between the outer surface of the second protective layer 142 and the inner surface of the first protective layer 141 along a circumference of the outer surface of the second protective layer 142. The first horizontal direction may mean any one of a horizontal direction, an x-axis direction, and a width direction. And, the second horizontal direction may mean any one of a vertical direction, a y-axis direction, and a length direction perpendicular to the first horizontal direction.

That is, a distance in a horizontal direction between the inner surface of the through hole 141T1 of the first protective layer 141 and the outer surface of the second protective layer 142 may include different distances along the inner surface of the through hole 141T1.

In this case, the separation distance and the distance may have the same meaning, and this can be expressed by replacing a spacing, an interval, width, a spacing width, etc.

For example, as shown in FIG. 7, the separation distance may include a first separation distance HL1 and a second separation distance HL2. Furthermore, the separation distance may further include a third separation distance HL3.

Specifically, the inner surface of the through hole 141T1 of the first protective layer 141 includes a protrusion surface 141P and a concave surface 141C. In addition, the outer surface of the second protective layer 142 may include a protrusion surface 142P and a concave surface 142C.

In addition, the first separation distance HL1, the second separation distance HL2, and the third separation distance HL3 may be different from each other.

For example, the first separation distance HL1 may be greater than the second separation distance HL2, and the second separation distance HL2 may be greater than the third separation distance HL3. For example, the first separation distance HL1 may be a largest distance and the third separation distance HL3 may be a smallest distance among the first separation distance HL1, second separation distance HL2, and third separation distance HL3.

The first separation distance HL1 means a distance in a horizontal direction of a region where the concave surface 141C of the inner surface of the first protective layer 141 and the concave surface 142C of the outer surface of the second protective layer 142 horizontally face each other in the separation region SA.

The second separation distance HL2 means a distance in a horizontal direction of a region where the protrusion surface 141P of the inner surface of the first protective layer 141 and the concave surface 142C of the outer surface of the second protective layer 142 horizontally face each other in the separation region SA.

The third separation distance HL3 means a distance in a horizontal direction of a region where the concave surface 141C of the inner surface of the first protective layer 141 and the protrusion surface 142P of the outer surface of the second protective layer 142 horizontally face each other in the separation region SA.

In this case, a difference between the first separation distance HL1, the second separation distance HL2, and the third separation distance HL3 of the separation region SA may be due to an arrangement structure of the first electrode 121 disposed in the separation region SA.

For example, the first electrodes 121 are disposed in a first separation region (e.g., a region corresponding to the first separation distance HL1) of the separation region SA in a larger number than other separation regions, or alternatively traces connected to the first electrode 121 may be intensively disposed in the first separation region.

In addition, the first electrode 121 and/or the trace may be disposed in a second separation region of the separation region SA (e.g., a region corresponding to the second separation distance HL2) with an integration density lower than that of the first separation region.

Here, integration density may mean a ratio of an area occupied by electrodes or traces of the circuit layer 120 in a certain area. For example, if a ratio of an area occupied by the electrode or trace in a certain unit area of the insulating layer 110 is relatively high, it may mean that the integration density is high.

In addition, the first electrode 121 and/or the trace may be disposed in a third separation region of the separation region SA (e.g., a region corresponding to the third separation distance HL3) with an integration density lower than that of the first separation region and the second separation region.

In other words, a separation distance between the first electrodes and/or traces disposed in the first separation region may be smaller than a separation distance between the first electrodes and/or traces disposed in the second separation region and the third separation region.

That is, the first electrodes or traces, which must have no mutual signal interference or a small mutual signal transmission distance, are intensively disposed in the first separation region. In addition, the embodiment arranges a first electrode and/or a trace that requires a certain separation distance due to mutual signal interference in the second or third separation region. Accordingly, the embodiment can improve the electrical reliability of the semiconductor package, thereby improving the electrical signal characteristics.

In this case, the first electrode 121 and the trace may be disposed in the first to third separation regions with the same integration density, but a distance between the first electrodes to be connected to each other may increase in this structure, and thus signal transmission loss may increase. Furthermore, when the first electrode 121 and the trace are disposed in the first to third separation regions with the same integration density, the first electrodes, where mutual signal interference occurs, must be spaced far apart, thereby increasing an overall area of the separation region SA. In addition, when the overall area of the separation region SA increases, it may increase the number of electrodes or traces not protected by the first protective layer 141 and the second protective layer 142, and thus, physical reliability and electrical reliability problems may occur.

In addition, If the first electrode 121 and traces having different integration densities may be disposed in the first and second separation regions and the separation distances of the separation region SA may be the same along a circumference of the inner surface of the first protective layer 141, it increases the area of electrodes and traces not covered by the first protective layer 141 or the second protective layer 142, and accordingly, it may cause a problem that the electrode or trace is delaminated due to thermal stress or the like.

Accordingly, the separation region SA has a first separation distance and a second separation distance different from each other along the circumference of the inner surface of the first protective layer 141 and the outer surface of the second protective layer 142. Therefore, the embodiment can improve signal transmission characteristics by having different circuit integration densities in the separation region SA and minimizing signal transmission loss due to a decrease in signal transmission distance. In addition, the embodiment allows a separation distance of a region having a relatively low circuit integration density among the separation regions smaller than a separation distance of a region having a high circuit integration density. Accordingly, the embodiment can minimize a reliability problem due to a trace not being covered by the first protective layer 141 or the second protective layer 142 in a separation region having a small separation distance. Furthermore, the embodiment may further improve electrical reliability and physical reliability of a semiconductor package.

Meanwhile, although the upper protective layer 140 is shown to be divided into a first protective layer 141 and a second protective layer 142 in the above description, it is not limited thereto. For example, the upper protective layer 140 may mean one configuration including a first opening corresponding to the separation region SA, a second opening corresponding to the first opening 141T2 of the first protective layer 141, a third opening corresponding to the second opening 141T3 of the first protective layer 141 and a fourth opening corresponding to the opening 142T of the second protective layer 142.

Hereinafter, an arrangement structure of electrodes and traces of the circuit layer 120 of the substrate 100 and corresponding structures of open regions of the first protective layer 141 and the second protective layer 142 will be described.

FIG. 8 is a plan view illustrating a circuit layer formed in region A of FIG. 1, and FIG. 9 is a plan view of a state in which a first protective layer and a second protective layer are disposed on the circuit layer of FIG. 8.

Referring to FIG. 8, the circuit layer 120 of the substrate 100 includes a first electrode 121, a second electrode 122 and a third electrode 124. In addition, the circuit layer 120 of the substrate 100 includes a trace connected to at least one of the first electrode 121, the second electrode 122, and the third electrode 124.

The first electrode 121, the second electrode 122, and the third electrode 124 mean a pad connected to a terminal 225 of the semiconductor device 220 mounted on the substrate 100, respectively.

In this case, the terminal 225 of the semiconductor device 220 is disposed on a lower surface of the semiconductor device 220. A lower surface of the semiconductor device 220 may be divided into a plurality of regions. For example, the lower surface of the semiconductor device 220 may be divided into an inner region, an outer region, and an intermediate region between the inner region and the outer region. In addition, the terminals 225 of the semiconductor device 220 are respectively disposed in the inner region, the outer region, and the intermediate region. In addition, the first electrode 121 of the circuit layer 120 of the substrate 100 is connected to a terminal disposed in the intermediate region of the semiconductor devices 220. In addition, the second electrode 122 of the circuit layer 120 of the substrate 100 is connected to a terminal disposed in an outer region of the semiconductor device 220. In addition, the third electrode 124 of the circuit layer 120 of the substrate 100 is connected to a terminal disposed in an inner region of the semiconductor device 220. In this case, at least one of the first electrode 121, the second electrode 122, and the third electrode 124 may have a different width or shape from at least the other one. For example, the terminal 225 of the semiconductor device 220 may have a different size or pitch depending on the arrangement position. Accordingly, the first electrode 121, the second electrode 122, and the third electrode 124 may have a width or shape corresponding to the size or pitch of the terminal 225 of the semiconductor device 220.

For example, the first electrode 121 may have a shape different from those of the second electrode 122 and the third electrode 124. The first electrode 121 is connected to a terminal having a relatively small pitch and size among the terminals 225 of the semiconductor device 220. Accordingly, a plane area of the first electrode 121 may be smaller than a plane area of each of the second electrode 122 and the third electrode 124.

In this case, the first electrode 121 may include a curved part having a specific radius of curvature around an upper surface thereof and a straight part connected to the curved part. For example, the upper surface of the first electrode 121 may include a plurality of curved parts facing each other and a plurality of straight parts connecting the plurality of curved parts. For example, a plane of the first electrode 121 may have an oval shape, but is not limited thereto.

In this case, a width W1 of the first electrode 121 in a first horizontal direction may be smaller than a width W2 of the second electrode 122 in the first horizontal direction and a width W3 of the third electrode 124 in the first horizontal direction.

For example, the width W1 of the first electrode 121 in a first horizontal direction may satisfy a range of 30% to 95% of the width W2 of the second electrode 122 in the first horizontal direction and the width W3 of the third electrode 124 in the first horizontal direction. For example, the width W1 of the first electrode 121 in a first horizontal direction may satisfy a range of 32% to 93% of the width W2 of the second electrode 122 in the first horizontal direction and the width W3 of the third electrode 124 in the first horizontal direction. For example, the width W1 of the first electrode 121 in a first horizontal direction may satisfy a range of 35% to 90% of the width W2 of the second electrode 122 in the first horizontal direction and the width W3 of the third electrode 124 in the first horizontal direction.

In addition, the width W2 of the second electrode 122 in the first horizontal direction and the width W3 of the third electrode 124 in the first horizontal direction may be the same to each other or may be different. For example, the width W2 of the second electrode 122 in the first horizontal direction may be smaller than the width W3 of the third electrode 124 in the first horizontal direction, but is not limited thereto. The second electrode 122 and the third electrode 124 have shapes different from those of the first electrode 121. For example, the second electrode 122 and the third electrode 124 may have a circular shape.

The width W2 of the second electrode 122 in the first horizontal direction and the width W3 of the third electrode 124 in the first horizontal direction may satisfy a range of 20 μm to 80 μm. For example, the width W2 of the second electrode 122 in the first horizontal direction and the width W3 of the third electrode 124 in the first horizontal direction may satisfy a range of 25 µm to 75 µm. For example, the width W2 of the second electrode 122 in the first horizontal direction and the width W3 of the third electrode 124 in the first horizontal direction may satisfy a range of 30 µm to 70 µm. When the width W2 of the second electrode 122 in the first horizontal direction and the width W3 of the third electrode 124 in the first horizontal direction are less than 20 µm, it may not be able to make a stable electrical connection with the terminal of the semiconductor device 220. In addition, when the width W2 of the second electrode 122 in the first horizontal direction and the width W3 of the third electrode 124 in the first horizontal direction exceed 80 µm, it may be difficult to place both the second electrode 122 and the third electrode 124 connected to the terminal of the semiconductor device 220 within a limited space.

Accordingly, the width W1 of the first electrode 121 in the first horizontal direction may satisfy a range of 7 µm to 76 µm. For example, the width W1 of the first electrode 121 in the first horizontal direction may be in the range of 10 µm to 70 µm. For example, the width W1 of the first electrode 121 in the first horizontal direction may satisfy a range of 15 µm to 58 µm. When the width W1 of the first horizontal direction of the first electrode 121 is less than 7 µm, it may be difficult to stably place the first connection part 210 on the first electrode 121, whereby an electrical short problem may occur due to the flowing down of the first connection part 210. When the width W1 of the first electrode 121 in the first horizontal direction exceeds 76 µm, a space for arranging a plurality of traces may not be secured between the plurality of first electrodes in the separation region SA. In addition, when the space for arranging the plurality of traces is not secured, pattern defects may occur in a process of forming the traces. For example, when the space for arranging the plurality of traces is not secured, it causes defects such as distortion of the trace, or an electrical short problem due to the trace being connected to an electrode or trace that should not be electrically connected in the process of forming the trace.

Meanwhile, widths of the first electrode 121, the second electrode 122, and the third electrode 124 in a second horizontal direction perpendicular to the first horizontal direction may be equal to each other.

In this case, the first electrode 121 may have a circular shape having the same width in the first horizontal direction and the second horizontal direction, but in this case, an electrical short problem may occur due to overflow of the first connection part 210 in a process of mounting the semiconductor device 220. That is, when the process of mounting the semiconductor device 220 proceeds in a state where the first connection part 210 is disposed, pressure is applied to the first connection part 210, and accordingly, the first connection portion 210 spreads in the horizontal direction. In this case, when the width of the first electrode 121 in the second horizontal direction is equal to the width W1 in the first horizontal direction, this may cause a problem of contact with neighboring traces or electrodes due to the spread of the first connection part 210.

Accordingly, the embodiment allows the first electrode 121 to have an elliptical shape having different widths in the first horizontal direction and the second horizontal direction. As a result, the embodiment allows the first electrode 121 to have a shape that is extended in a direction with a relatively generous pitch. Accordingly, the embodiment allows the first connection part 210 to be spread in the direction in which the risk of electrical short circuit of the circuit is relatively low, and accordingly, it can dramatically solve the electrical short problem.

In addition, the width W1 of the first horizontal direction of the first electrodes 121 disposed in the separation region SA is smaller than a size of an opening that can be formed through an exposure and development process of the first protective layer 141 or the second protective layer 142 (or according to process capability). Accordingly, when the first protective layer 141 or the second protective layer 142 is disposed in the separation region SA and openings overlapping each of the first electrodes in the vertical direction are formed in the first protective layer 141 or the second protective layer 142, an upper surface of the at least one first electrode may not overlap with the opening in the vertical direction due to the formation process capability and process deviation of the opening, as a result, it may cause an electrical reliability problem that cannot be electrically connected to the semiconductor device 220.

Accordingly, the embodiment allows the inner surface of the through hole 141T1 of the first protective layer 141 to have a step in the horizontal direction or the outer surface of the second protective layer 142 to have a step in the horizontal direction in order to minimize an area of the separation region while preventing the first protective layer 141 and the second protective layer 142 from being disposed in the separation region SA. Accordingly, the embodiment may improve electrical reliability and physical reliability of the semiconductor package.

Referring to FIG. 9, the circuit layer 120 of the substrate 100 of the embodiment includes a first electrode 121 and first traces disposed in the separation region SA between the first protective layer 141 and the second protective layer 142.

In addition, the circuit layer 120 of the substrate 100 includes a second electrode 122 disposed adjacent to the separation region SA and disposed in a first region R1 vertically overlapping the first opening 141T2 of the first protective layer 141.

In addition, the circuit layer 120 of the substrate 100 includes a third electrode 124 disposed in a second region R2 overlapping the opening 142T of the second protective layer 142 in a vertical direction.

Meanwhile, the inner surface of the protrusion surface 141P of the inner surface of the first protective layer 141 of the embodiment may not have a step, or alternatively may be formed with a step.

FIG. 10 is a cross-sectional view illustrating a protrusion surface of a first protective layer according to a first embodiment, FIGS. 11A to 11C are cross-sectional views illustrating a protrusion surface of a first protective layer according to a second embodiment, FIGS. 12A and 12B are cross-sectional views illustrating a protrusion surface of a first protective layer according to a third embodiment, and FIG. 13 is a cross-sectional view illustrating a step structure in a vertical direction of an inner surface of a first protective layer according to a fourth embodiment.

Referring to FIG. 10, an inner surface of the through hole 141T1 of the first protective layer of the embodiment may not have a step in a vertical direction.

For example, the inner surface constituting the through hole 141T1 of the first protective layer 141 includes a protrusion surface 141P as shown in FIG. 10 (a). In addition, the inner surface of the through hole 141T1 of the first protective layer 141 includes a reference surface 141B as shown in FIG. 10 (b). The protrusion surface 141P protrudes by a predetermined width W4 in a horizontal direction based on the reference surface 141B. For example, the protrusion surface 141P protrudes toward an outer surface of the second protective layer 142 in a horizontal direction based on the reference surface 141B by the width W4. In this case, the inner surface of the through hole 141T1 of the first protective layer 141 may not have a step in the vertical direction. For example, each of the protrusion surface 141P and the reference surface 141B of the through hole 141T1 of the first protective layer 141 may be the same as a width of a portion adjacent to the upper surface of the first protective layer 141 and a width of a portion adjacent to a lower surface of the first protective layer 141. For example, each inner surface of the protrusion surface 141P and the reference surface 141B of the through hole 141T1 of the first protective layer 141 may have an inclination with no change in width in a direction from the upper surface of the first protective layer 141 to the lower surface.

Meanwhile, each inner surface of the protrusion surface 141P and the reference surface 141B of the through hole 141T1 of the first protective layer 141 may have a step in the vertical direction. Hereinafter, the protrusion surface 141P of the through hole 141T1 of the first protective layer 141 will be described as a reference. Correspondingly, the reference surface or the concave surface of the through hole 141T1 of the first protective layer 141 may also have a step in the vertical direction.

In the second embodiment, an inner surface of a protrusion surface 141P may have an inclination in which a width increases in a vertical direction as it approaches the lower surface of the substrate 100. In this case, the protrusion surface 141P may be provided on an inner corner portion of the inner surface of the first protective layer 141.

As an example, referring to FIG. 11A, an inner surface of the protrusion surface 141P of the through hole 141T1 of the first protective layer 141 may have an inclination in which a width gradually increases as it approaches an upper surface of the substrate 100.

As another embodiment, referring to FIG. 11B, the inner surface of the protrusion surface 141P of the through hole 141T1 of the first protective layer 141 may have a certain curvature of an inclination in which a width increases as it is approaches to the upper surface of the substrate 100.

As another embodiment, referring to FIG. 11C, the inner surface of the protrusion surface 141P of the through hole 141T1 of the first protective layer 141 may have a stair-shaped step in which the width does not change and then increases as it is approaches to the lower surface of the substrate 100. In addition, the number of the stair-shaped step may be one, or two or more.

As another embodiment, referring to FIG. 11D, the inner surface of the protrusion surface 141P of the through hole 141T1 of the first protective layer 141 may include a first inner surface adjacent to the upper surface of the substrate 100 and having a first curvature whose width increases toward the lower surface of the substrate 100 and a second inner surface having a second curvature adjacent to the lower surface of the substrate 100 and decreasing in width toward the upper surface of the substrate 100. In this case, the first curvature and the second curvature may be the same or different from each other. In addition, although the inner surface of the protruding surface 141P in FIG. 11D is illustrated as including two curvatures, it is not limited thereto. For example, the inner surface of the protruding surface 141P may include three or more curvatures.

In addition, an inner surface of a protrusion surface 141P in another embodiment may have a shape in which the slope of the inner surface of FIG. 11C and the slope of the inner surface of FIG. 11D are combined. The inner surface of the protrusion surface 141P in a third embodiment may have an inclination in which a width decreases in a vertical direction as it approaches the lower surface of the substrate 100. In this case, the protrusion surface 141P may be provided on an inner corner portion of the upper surface of the first protective layer 141.

As an example, referring to FIG. 12A, the inner surface of the protrusion surface 141P constituting the through hole 141T1 of the first protective layer 141 may include a recessed portion 141R adjacent to the lower surface of the substrate 100. The recessed portion 141R may be provided adjacent to the lower surface of the first protective layer 141 on the inner surface of the protrusion surface 141P. Therefore, the inner surface of the protrusion surface 141P may include a first inner surface adjacent to the upper surface of the first protective layer 141 and having a first slope having no change in width and a second inner surface adjacent to the lower surface of the first protective layer 141 and having a second slope with no change in width and having a step difference with the first inner surface. For example, the inner surface of the protruding surface 141P may have a stair-shaped step with a large width at a portion adjacent to the upper surface of the first protective layer 141.

As another embodiment, referring to FIG. 12B, a second slope of the inner surface of the protrusion surface 141P may have a slope whose width decreases toward the lower surface of the first protective layer 141 in contrast to FIG. 12A. In this case, the second slope may have a straight line shape whose width gradually decreases toward the lower surface of the first protective layer 141, or may have a curved shape with a certain curvature as shown in the drawing.

As another embodiment, referring to FIG. 13, a first slope of the inner surface of the protrusion surface 141P may have a slope in which the width decreases toward the lower surface of the first protective layer 141 in contrast to FIG. 12B. In this case, the first slope may have a straight-line shape in which a width gradually decreases toward the lower surface of the first protective layer 141 as shown in the drawing, or may have a curved shape having a certain curvature. Meanwhile, it is shown that the step in the vertical direction is one in FIGS. 12A, 12B, and 13, but is not limited thereto. For example, two or more steps in the vertical direction may be provided by a combination of at least three of the slopes shown in FIGS. 12A, 12B, and 13.

FIGS. 14 to 27 are cross-sectional views illustrating a method of manufacturing a semiconductor package according to an exemplary embodiment in a process order.

Hereinafter, a method of manufacturing the semiconductor package of FIG. 1 will be described in the order of processes with reference to FIGS. 14 to 27. Meanwhile, semiconductor packages of the second and third embodiments may be manufactured based on a manufacturing process described below.

Referring to FIG. 14, the embodiment prepares a material that is the basis for manufacturing the substrate 100. For example, the embodiment prepares a carrier board for manufacturing the substrate 100 of the ETS structure. The carrier board includes a carrier insulating layer CB1 and a carrier metal layer CB2 disposed on at least one surface of the carrier insulating layer CB1. FIG. 14 shows that the carrier metal layer CB2 is disposed only on the lower surface of the carrier insulating layer CB1, but is not limited thereto. For example, the carrier metal layer CB2 may also be disposed on an upper surface of the carrier insulating layer CB1. Accordingly, the embodiment may proceed with a process of simultaneously manufacturing a plurality of substrates 100 using carrier metals CB2 disposed on both sides of the carrier insulating layer CB1, respectively.

Next, referring to FIG. 15, the embodiment may proceed with a process of forming a part of the circuit layer 120 of the substrate 100 on the lower surface of the carrier metal layer CB2 using the carrier metal layer CB2 disposed on at least one surface of the carrier insulating layer CB1 as a seed layer. For example, the embodiment may proceed with a process of forming electrodes 120a, which are circuit layers disposed on an uppermost side of the substrate 100, on the lower surface of the carrier metal layer CB2.

Next, referring to FIG. 16, when the electrodes 120a are formed, the embodiment may proceed with a process of laminating the insulating layer 110, a process of forming a through hole, a process of forming a through electrode, and a process of forming a circuit layer at least once, and accordingly, the substrate 100 may be manufactured.

Next, referring to FIG. 17, the embodiment may proceed with a process of removing the carrier board. For example, the embodiment may proceed with a process of separating the carrier insulating layer CB1 and the carrier metal layer CB2. Next, the embodiment may proceed with a process of removing the carrier metal layer CB2 disposed on the substrate 100 by etching.

Next, referring to FIG. 18, the embodiment may proceed with a process of forming a first protective layer 141 of an upper protective layer 140 on the substrate 100. To this end, the embodiment may proceed with a process of applying an insulating material entirely covering the upper part of the substrate 100, a process of removing the applied insulating material by exposure and development, and a process of forming the through hole 141T1, the first opening 141T2, and the second opening 141T3 of the first protective layer 141.

Correspondingly, the embodiment may proceed with a process of forming the lower protective layer 150 under a lower portion of the substrate 100.

Next, referring to FIG. 19, the embodiment may proceed with a process of forming a second protective layer 142 inside the through hole 141T1 of the first protective layer 141 on the substrate 100. In this case, a separation region SA between the second protective layer 142 and the first protective layer 141 and an opening 142T of the second protective layer 142 can be formed in the process of forming the second protective layer 142.

Meanwhile, in the above description, the process of forming the first protective layer 141 and the second protective layer 142 of the upper protective layer 140 is performed in stages, but is not limited thereto.

For example, the embodiment may proceed with a process of entirely forming an insulating material 140R for forming a first protective layer 141 and a second protective layer 142 on the substrate 100 as shown in FIG. 20.

Next, the embodiment may proceed with a process of removing the insulating material 140R by exposure and development and a process of forming the separation region SA, the first opening 141T2 of the first protective layer 141, the second opening 141T3 of the first protective layer 141, and the opening 142T of the second protective layer 142 as shown in FIG. 21.

Next, the embodiment may proceed with a process of disposing the first connection part 210 on the substrate 100 as shown in FIG. 22. For example, the embodiment may proceed with a process of arranging the first connection part 210 on a first electrode 121 overlapping the separation region SA in a vertical direction, a second electrode 122 vertically overlapping the first opening 141T2 of the first protective layer 141 and a third electrode 124 overlapping the opening 142T of the second protective layer 142 in a vertical direction.

Next, the embodiment may proceed with a process of mounting the semiconductor device 220 on the first connection part 210 as shown in FIG. 23. Accordingly, a terminal 225 of the semiconductor device 220 may be electrically connected to the first electrode 121, the second electrode 122, and the third electrode 124 through the first connection part 210, respectively. In this case, the semiconductor device 220 has a structure disposed on the second protective layer 142. Furthermore, at least a portion of the semiconductor device 220 may have a structure disposed on the first protective layer 141.

Next, the embodiment may proceed with a process of forming an underfill 230 covering the periphery of the semiconductor device 220 mounted on the substrate 100 as shown in FIG. 24.

In addition, the embodiment may proceed with a process of forming the third connection part 260 in the opening of the lower protective layer 150 disposed on the lower surface of the substrate 100.

Next, the embodiment may proceed with a process of forming the second connection part 240 on the fourth electrode 123 overlapping the second opening 141T3 of the first protective layer 141 in a vertical direction as shown in FIG. 25. The second connection part 240 may be a post bump protruding with a certain height.

Next, the embodiment may proceed with a process of forming a molding layer 250 for molding an upper portion of the first protective layer 141, an upper portion of the second protective layer 142, the second connection part 240, the semiconductor device 220, and the underfill 230 as shown in FIG. 26.

On the other hand, the embodiment may selectively proceed with a process of polishing the upper surface of the molding layer 250 after the molding layer 250 is formed. In addition, the molding layer 250 may have an opening overlapping with the second connection part 240 in a vertical direction by a polishing process of the molding layer 250.

Next, the embodiment may proceed with a process of attaching the external substrate 300 on which the semiconductor device 420 is mounted on the second connection part 240 as shown in FIG. 27.

A semiconductor package of an embodiment includes a substrate. In addition, the semiconductor package includes a first protective layer disposed on the substrate and having a through hole. In addition, the semiconductor package includes a second protective layer disposed on the substrate and disposed inside the through hole of the first protective layer.

In this case, an inner surface of the first protective layer includes a protrusion surface protruding toward the second protective layer. For example, an outer surface of the second protective layer includes a protrusion surface protruding toward the first protective layer.

Accordingly, a separation distance in a horizontal direction between the inner surface of the through hole of the first protective layer and the outer surface of the second protective layer may include different separation distances along the inner surface of the through hole.

For example, the separation distance may include a first separation distance and a second separation distance. In addition, the first separation distance and the second separation distance may be different from each other. For example, the first separation distance may be greater than the second separation distance.

In this case, first electrodes and traces of a circuit layer of the substrate may be intensively disposed in the first separation region corresponding to the first separation distance rather than in the second separation region corresponding to the second separation distance. For example, a distance between first electrodes and/or traces disposed in the first separation region may be smaller than a distance between first electrodes and/or traces disposed in the second separation region.

This means that the integration density of the circuit layer in the first separation region is higher than the integration density of the circuit layer in the second separation region.

In this case, the first electrodes and the traces may be disposed in the first and second separation regions with the same integration density. However, it may increase the distance between the first electrodes to be connected to each other, thereby increasing the signal transmission loss. Furthermore, when the first electrodes and traces are disposed with the same integration density in the first and second separation regions, an overall area of the separation region may increase because the first electrodes where mutual signal interference occurs should be farther apart. In addition, when the overall of the separation region increases, the number of electrodes or traces not protected by the first protective layer and the second protective layer increases, and accordingly, it may cause physical reliability and electrical reliability problems.

In addition, first electrodes and traces having different integration densities may be disposed in the first and second separation regions, and the separation distances of the separation regions may be the same along a circumference of the inner surface of the first protective layer. However, it increases the area of electrodes and traces not covered by the first protective layer or the second protective layer, and accordingly, it may cause a problem that the electrode or trace is delaminated due to thermal stress or the like.

Accordingly, the separation region has a first separation distance and a second separation distance different from each other along the circumference of the inner surface of the first protective layer and the outer surface of the second protective layer. Therefore, the embodiment can improve signal transmission characteristics by having different circuit integration densities in the separation region and minimizing signal transmission loss due to a decrease in signal transmission distance. In addition, the embodiment allows a separation distance of a region having a relatively low circuit integration density among the separation regions smaller than a separation distance of a region having a high circuit integration density. Accordingly, the embodiment can minimize a reliability problem due to a trace not being covered by the first protective layer or the second protective layer in a separation region having a small separation distance. Furthermore, the embodiment may further improve electrical reliability and physical reliability of a semiconductor package.

On the other hand, when the circuit board having the above-described characteristics of the invention is used in an IT device or home appliance such as a smart phone, a server computer, a TV, and the like, functions such as signal transmission or power supply can be stably performed. For example, when the circuit board having the features of the present invention performs a semiconductor package function, it can function to safely protect the semiconductor chip from external moisture or contaminants, or alternatively, it is possible to solve problems of leakage current, electrical short circuit between terminals, and electrical opening of terminals supplied to the semiconductor chip. In addition, when the function of signal transmission is in charge, it is possible to solve the noise problem. Through this, the circuit board having the above-described characteristics of the invention can maintain the stable function of the IT device or home appliance, so that the entire product and the circuit board to which the present invention is applied can achieve functional unity or technical interlocking with each other.

When the circuit board having the characteristics of the invention described above is used in a transport device such as a vehicle, it is possible to solve the problem of distortion of a signal transmitted to the transport device, or alternatively, the safety of the transport device can be further improved by safely protecting the semiconductor chip that controls the transport device from the outside and solving the problem of leakage current or electrical short between terminals or the electrical opening of the terminal supplied to the semiconductor chip. Accordingly, the transportation device and the circuit board to which the present invention is applied can achieve functional integrity or technical interlocking with each other. Furthermore, when the circuit board having the above-described characteristics of the invention is used in a transportation device such as a vehicle, it is possible to transmit a high-current signal required by the vehicle at a high speed, thereby improving the safety of the transportation device. Furthermore, the circuit board and the semiconductor package including the same can be operated normally even in an unexpected situation occurring in various driving environments of the transportation device, thereby safely protecting the driver.

Features, structures, effects, etc. described in the above embodiments are included in at least one embodiment, and it is not necessarily limited to only one embodiment. Furthermore, features, structures, effects, etc. illustrated in each embodiment can be combined or modified for other embodiments by those of ordinary skill in the art to which the embodiments belong. Accordingly, the contents related to such combinations and variations should be interpreted as being included in the scope of the embodiments.

In the above, the embodiment has been mainly described, but this is only an example and does not limit the embodiment, and those of ordinary skill in the art to which the embodiment pertains will appreciate that various modifications and applications not illustrated above are possible without departing from the essential characteristics of the present embodiment. For example, each component specifically shown in the embodiment can be implemented by modification. And the differences related to these modifications and applications should be interpreted as being included in the scope of the embodiments set forth in the appended claims.

What is claimed is:

1. A circuit board comprising:
   a substrate;
   a first protective layer disposed on the substrate and including a first through hole; and
   a second protective layer disposed inside the first through hole and spaced apart from the first protective layer in a horizontal direction and including a plurality of second through holes,
   wherein the second protective layer includes a plurality of inner surfaces forming the plurality of second through holes, and an outer surface surrounding the plurality of inner surfaces, wherein an inner surface forming the first through hole of the first protective layer and the outer surface of the second protective layer each include one surface facing each other in the horizontal direction, and wherein a separation area between the one surface of the first protective layer and the one surface of the second protective layer includes a first separation area having a first width along the horizontal direction, and a second separation area having a second width different from the first width.

2. The circuit board of claim 1, wherein the first protective layer includes a plurality of third through holes disposed around the first through hole.

3. The circuit board of claim 2, wherein the at least some of the plurality of third through holes have a width greater than a width of the second through holes.

4. The circuit board of claim 3, wherein at least some of the plurality of third through holes include a post, and wherein a thickness of the post in a vertical direction is thicker than a thickness of the second protective layer in the vertical direction.

5. The circuit board of claim 1, wherein the separation area is provided as a closed loop along the outer surface of the second protective layer.

6. The circuit board of claim 1, wherein at least a portion of one surface of the first protective layer and at least a portion of one surface of the second protective layer are parallel to each other.

7. The circuit board of claim 1, wherein the first width is greater than the second width.

8. The circuit board of claim 7, wherein one surface of the first protective layer includes a first protruding surface protruding toward the outer surface of the second protective layer, and wherein the first protruding surface forms the second separation area.

9. The circuit board of claim 7, wherein one surface of the second protective layer includes a second protruding surface protruding toward the inner surface of the first protective layer, and wherein the second protruding surface forms the second separation area.

10. The circuit board of claim 7, wherein the substrate includes a plurality of pads disposed on an upper surface of the substrate, and wherein a number of pads vertically overlapping with the first separation area among the plurality of pads is greater than a number of pads vertically overlapping with the second separation area.

11. The circuit board of claim 7, wherein the separation area includes a third separation area having a third width smaller than the second width along the horizontal direction.

12. The circuit board of claim 1, wherein the substrate includes a first area vertically overlapping with the first protective layer, a second area vertically overlapping with the second protective layer, and a third area between the inner surface of the first protective layer and the outer surface of the second protective layer.

13. The circuit board of claim 12, wherein the substrate includes a plurality of pads and a plurality of traces disposed on an upper surface of the substrate, wherein the plurality of pads includes a first pad portion disposed in the third area, the first pad portion having an exposed top surface, and wherein the plurality of traces includes a first trace portion disposed in the third area, the first trace portion having an exposed top surface.

14. The circuit board of claim 13, wherein the plurality of pads include a second pad portion vertically overlapping the plurality of second through holes.

15. The circuit board of claim 1, wherein the inner surface of the first protective layer includes a first inner surface, a second inner surface facing the first inner surface, a third inner surface and a fourth inner surface disposed between the first inner surface and the second inner surface and facing each other, wherein the outer surface of the second protective layer includes a first outer surface adjacent to the first inner surface, a second outer surface adjacent to the second inner surface, a third outer surface adjacent to the third inner surface, and a fourth outer surface adjacent to the fourth inner surface, wherein the first inner surface of the first protective layer includes one surface of the first protective layer, and wherein the first outer surface of the second protective layer includes one surface of the second protective layer.

16. The circuit board of claim 15, wherein the plurality of inner surfaces forming the plurality of second through holes are closed loops.

17. A semiconductor package comprising:

a circuit board according to claim 15; and a semiconductor device disposed on the second protective layer of the circuit board, wherein the semiconductor device is electrically connected to a second pad portion of a plurality of pads disposed on an upper surface of the substrate.

18. A circuit board comprising:

a substrate;

a first protective layer disposed on the substrate and including a first through hole; and a second protective layer disposed inside the first through hole and spaced apart from the first protective layer in a horizontal direction and including a plurality of second through holes, wherein the second protective layer includes a plurality of inner surfaces forming the plurality of second through holes, and an outer surface surrounding the plurality of inner surfaces, wherein a separation area between an inner surface forming the first through hole of the first protective layer and the outer surface of the second protective layer is provided as a closed loop along the outer surface of the second protective layer, wherein each of the inner surface of the first protective layer and the outer surface of the second protective layer are at least partially parallel to each other, wherein the substrate includes an uppermost insulating layer, and a plurality of pads and a plurality of traces disposed on an upper surface of the uppermost insulating layer, wherein the uppermost insulating layer includes a first region vertically overlapping with the first protective layer, a second region vertically overlapping with the second protective layer, and a third region between the inner surface of the first protective layer and the outer surface of the second protective layer, and wherein first electrodes of the plurality of pads and the plurality of traces are disposed in the third region.

19. The circuit board of claim 18, wherein the inner surface of the first protective layer comprises a first inner surface, a second inner surface facing the first inner surface, a third inner surface, and a fourth inner surface, wherein the third inner surface and the fourth inner surface are disposed between the first inner surface and the second inner surface and face each other, and wherein the outer surface of the second protective layer comprises a first outer surface adjacent to the first inner surface, a second outer surface adjacent to the second inner surface, a third outer surface adjacent to the third inner surface and connected to the first outer surface and the second outer surface, and a fourth outer surface adjacent to the fourth inner surface and connected to the first outer surface and the second outer surface.

20. The circuit board of claim 19, wherein a third electrode of the plurality of pads is disposed in an area that vertically overlaps the plurality of second through holes of the second protective layer.

21. The circuit board of claim 19, wherein each of the first to fourth outer surfaces comprises a protruding edge or a concave edge toward an adjacent inner surface among the first to fourth inner surfaces.

* * * * *